US009589808B2

(12) United States Patent
Bamnolker et al.

(10) Patent No.: US 9,589,808 B2
(45) Date of Patent: Mar. 7, 2017

(54) METHOD FOR DEPOSITING EXTREMELY LOW RESISTIVITY TUNGSTEN

(71) Applicant: LAM Research Corporation, Fremont, CA (US)

(72) Inventors: Hanna Bamnolker, Cupertino, CA (US); Raashina Humayun, Fremont, CA (US); Deqi Wang, San Jose, CA (US); Yan Guan, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/135,375

(22) Filed: Dec. 19, 2013

(65) Prior Publication Data

US 2015/0179461 A1  Jun. 25, 2015

(51) Int. Cl.
*H01L 21/44* (2006.01)
*H01L 21/285* (2006.01)
*C23C 16/14* (2006.01)
*C23C 16/02* (2006.01)
*C23C 16/04* (2006.01)
*C23C 16/455* (2006.01)
*H01L 21/768* (2006.01)

(52) U.S. Cl.
CPC .... *H01L 21/28556* (2013.01); *C23C 16/0209* (2013.01); *C23C 16/0281* (2013.01); *C23C 16/045* (2013.01); *C23C 16/14* (2013.01); *C23C 16/45523* (2013.01); *H01L 21/76843* (2013.01); *H01L 21/76864* (2013.01); *H01L 21/76876* (2013.01); *H01L 21/76877* (2013.01)

(58) Field of Classification Search
CPC ............... H01L 21/28556; H01L 21/67; H01L 21/28518; H01L 21/76864; H01L 23/53204; H01L 29/4966; H01L 29/518; H01L 21/76843; H01L 21/76876; H01L 21/76877; C23C 16/06; C23C 16/0209; C23C 16/0281; C23C 16/045; C23C 16/14; C23C 16/45523
USPC .......................................... 438/656; 118/697
See application file for complete search history.

(56) References Cited

U.S. PATENT DOCUMENTS

| 4,746,375 A | 5/1988 | Iacovangelo |
| 4,804,560 A | 2/1989 | Shioya et al. |
| 4,874,719 A | 10/1989 | Kurosawa |

(Continued)

FOREIGN PATENT DOCUMENTS

| CN | 101899649 A | 12/2010 |
| CN | 103125013 A | 5/2013 |

(Continued)

OTHER PUBLICATIONS

U.S. Appl. No. 13/862,048, filed Apr. 12, 2013, entitled "CVD Based Metal/Semiconductor OHMIC Contact for High Volume Manufacturing Applications."

(Continued)

*Primary Examiner* — Duy T Nguyen
(74) *Attorney, Agent, or Firm* — Weaver Austin Villeneuve & Sampson LLP

(57) ABSTRACT

Methods for depositing extremely low resistivity tungsten in semiconductor processing are disclosed herein. Methods involve annealing the substrate at various times during the tungsten deposition process to achieve uniform tungsten layers with substantially lower resistivity.

14 Claims, 11 Drawing Sheets

(56) References Cited

U.S. PATENT DOCUMENTS

| | | |
|---|---|---|
| 4,962,063 A | 10/1990 | Maydan et al. |
| 5,028,565 A | 7/1991 | Chang et al. |
| 5,227,329 A | 7/1993 | Kobayashi et al. |
| 5,250,329 A | 10/1993 | Miracky et al. |
| 5,250,467 A | 10/1993 | Somekh et al. |
| 5,308,655 A | 5/1994 | Eichman et al. |
| 5,326,723 A | 7/1994 | Petro et al. |
| 5,370,739 A | 12/1994 | Foster et al. |
| 5,391,394 A | 2/1995 | Hansen |
| 5,567,583 A | 10/1996 | Wang et al. |
| 5,633,200 A * | 5/1997 | Hu .................. C23C 14/0641 204/192.17 |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,833,817 A | 11/1998 | Tsai et al. |
| 5,913,145 A | 6/1999 | Lu et al. |
| 5,916,634 A | 6/1999 | Fleming et al. |
| 5,926,720 A | 7/1999 | Zhao et al. |
| 5,956,609 A | 9/1999 | Lee et al. |
| 5,963,833 A | 10/1999 | Thakur |
| 5,994,749 A | 11/1999 | Oda |
| 6,001,729 A | 12/1999 | Shinriki et al. |
| 6,017,818 A | 1/2000 | Lu |
| 6,034,419 A | 3/2000 | Nicholls et al. |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,174,812 B1 | 1/2001 | Hsiung et al. |
| 6,206,967 B1 | 3/2001 | Mak et al. |
| 6,245,654 B1 | 6/2001 | Shih et al. |
| 6,265,312 B1 | 7/2001 | Sidhwa et al. |
| 6,277,744 B1 | 8/2001 | Yuan et al. |
| 6,284,316 B1 | 9/2001 | Sandhu et al. |
| 6,287,965 B1 | 9/2001 | Kang et al. |
| 6,294,468 B1 | 9/2001 | Gould-Choquette et al. |
| 6,297,152 B1 | 10/2001 | Itoh et al. |
| 6,306,211 B1 | 10/2001 | Takahashi et al. |
| 6,309,966 B1 | 10/2001 | Govindarajan et al. |
| 6,310,300 B1 | 10/2001 | Cooney et al. |
| 6,340,629 B1 * | 1/2002 | Yeo et al. ................ 438/592 |
| 6,355,558 B1 | 3/2002 | Dixit et al. |
| 6,404,054 B1 | 6/2002 | Oh et al. |
| 6,429,126 B1 | 8/2002 | Herner et al. |
| 6,465,347 B2 | 10/2002 | Ishizuka et al. |
| 6,491,978 B1 | 12/2002 | Kalyanam |
| 6,551,929 B1 | 4/2003 | Kori et al. |
| 6,566,250 B1 | 5/2003 | Tu et al. |
| 6,566,262 B1 | 5/2003 | Rissman et al. |
| 6,581,258 B2 | 6/2003 | Yoneda et al. |
| 6,593,233 B1 | 7/2003 | Miyazaki et al. |
| 6,607,976 B2 | 8/2003 | Chen et al. |
| 6,635,965 B1 | 10/2003 | Lee et al. |
| 6,706,625 B1 | 3/2004 | Sudijono et al. |
| 6,720,261 B1 | 4/2004 | Anderson et al. |
| 6,740,585 B2 | 5/2004 | Yoon et al. |
| 6,777,331 B2 | 8/2004 | Nguyen |
| 6,797,340 B2 | 9/2004 | Fang et al. |
| 6,844,258 B1 | 1/2005 | Fair et al. |
| 6,861,356 B2 | 3/2005 | Matsuse et al. |
| 6,902,763 B1 | 6/2005 | Elers et al. |
| 6,903,016 B2 | 6/2005 | Cohen |
| 6,905,543 B1 | 6/2005 | Fair et al. |
| 6,908,848 B2 | 6/2005 | Koo |
| 6,936,538 B2 | 8/2005 | Byun |
| 6,939,804 B2 | 9/2005 | Lai et al. |
| 6,962,873 B1 | 11/2005 | Park |
| 7,005,372 B2 | 2/2006 | Levy et al. |
| 7,141,494 B2 | 11/2006 | Lee et al. |
| 7,157,798 B1 | 1/2007 | Fair et al. |
| 7,211,144 B2 | 5/2007 | Lu et al. |
| 7,220,671 B2 | 5/2007 | Simka et al. |
| 7,235,486 B2 | 6/2007 | Kori et al. |
| 7,262,125 B2 | 8/2007 | Wongsenakhum et al. |
| 7,355,254 B2 | 4/2008 | Datta et al. |
| 7,416,979 B2 | 8/2008 | Yoon et al. |
| 7,419,904 B2 | 9/2008 | Kato |
| 7,429,402 B2 | 9/2008 | Gandikota et al. |
| 7,465,665 B2 | 12/2008 | Xi et al. |
| 7,465,666 B2 | 12/2008 | Kori et al. |
| 7,501,343 B2 | 3/2009 | Byun et al. |
| 7,501,344 B2 | 3/2009 | Byun et al. |
| 7,563,718 B2 | 7/2009 | Kim |
| 7,589,017 B2 | 9/2009 | Chan et al. |
| 7,595,263 B2 | 9/2009 | Chung et al. |
| 7,605,083 B2 | 10/2009 | Lai et al. |
| 7,611,990 B2 | 11/2009 | Yoon et al. |
| 7,655,567 B1 | 2/2010 | Gao et al. |
| 7,674,715 B2 | 3/2010 | Kori et al. |
| 7,675,119 B2 | 3/2010 | Taguwa |
| 7,691,749 B2 | 4/2010 | Levy et al. |
| 7,695,563 B2 | 4/2010 | Lu et al. |
| 7,709,385 B2 | 5/2010 | Xi et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,754,604 B2 | 7/2010 | Wongsenakhum et al. |
| 7,772,114 B2 | 8/2010 | Chan et al. |
| 7,955,972 B2 | 6/2011 | Chan et al. |
| 7,964,505 B2 | 6/2011 | Khandelwal et al. |
| 7,977,243 B2 | 7/2011 | Sakamoto et al. |
| 8,048,805 B2 | 11/2011 | Chan et al. |
| 8,053,365 B2 | 11/2011 | Humayun et al. |
| 8,058,170 B2 | 11/2011 | Chandrashekar et al. |
| 8,062,977 B1 | 11/2011 | Ashtiani et al. |
| 8,071,478 B2 | 12/2011 | Wu et al. |
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,709,948 B2 | 4/2014 | Danek et al. |
| 8,853,080 B2 | 10/2014 | Guan et al. |
| 8,975,184 B2 | 3/2015 | Chen et al. |
| 8,993,055 B2 | 3/2015 | Rahtu et al. |
| 9,034,760 B2 | 5/2015 | Chen et al. |
| 9,076,843 B2 | 7/2015 | Lee et al. |
| 9,153,486 B2 | 10/2015 | Arghavani et al. |
| 9,159,571 B2 | 10/2015 | Humayun et al. |
| 9,236,297 B2 | 1/2016 | Chen et al. |
| 9,240,347 B2 | 1/2016 | Chandrashekar et al. |
| 2001/0007797 A1 * | 7/2001 | Jang .................. C23C 16/0272 438/761 |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0090796 A1 | 7/2002 | Desai et al. |
| 2002/0090811 A1 | 7/2002 | Kim et al. |
| 2002/0117399 A1 | 8/2002 | Chen et al. |
| 2002/0132472 A1 | 9/2002 | Park |
| 2002/0155722 A1 | 10/2002 | Satta et al. |
| 2002/0168840 A1 | 11/2002 | Hong et al. |
| 2002/0177316 A1 | 11/2002 | Miller et al. |
| 2003/0059980 A1 | 3/2003 | Chen et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen et al. |
| 2003/0190802 A1 | 10/2003 | Wang et al. |

(56) References Cited

U.S. PATENT DOCUMENTS

| | | | |
|---|---|---|---|
| 2003/0224217 A1* | 12/2003 | Byun et al. | 428/698 |
| 2004/0014315 A1 | 1/2004 | Lai et al. | |
| 2004/0044127 A1 | 3/2004 | Okubo et al. | |
| 2004/0142557 A1 | 7/2004 | Levy et al. | |
| 2004/0151845 A1 | 8/2004 | Nguyen et al. | |
| 2004/0202786 A1 | 10/2004 | Wongsnakhum et al. | |
| 2004/0206267 A1 | 10/2004 | Sambasivan et al. | |
| 2004/0247788 A1 | 12/2004 | Fang et al. | |
| 2005/0031786 A1 | 2/2005 | Lee et al. | |
| 2005/0059236 A1 | 3/2005 | Nishida et al. | |
| 2005/0136594 A1 | 6/2005 | Kim | |
| 2005/0179141 A1 | 8/2005 | Yun et al. | |
| 2005/0191803 A1 | 9/2005 | Matsuse et al. | |
| 2006/0003581 A1 | 1/2006 | Johnston et al. | |
| 2006/0075966 A1 | 4/2006 | Chen et al. | |
| 2006/0094238 A1 | 5/2006 | Levy et al. | |
| 2006/0145190 A1 | 7/2006 | Salzman et al. | |
| 2006/0211244 A1 | 9/2006 | Deshpande et al. | |
| 2006/0284317 A1 | 12/2006 | Ito et al. | |
| 2007/0087560 A1 | 4/2007 | Kwak et al. | |
| 2007/0099420 A1 | 5/2007 | Dominquez et al. | |
| 2007/0190780 A1 | 8/2007 | Chung et al. | |
| 2008/0045010 A1 | 2/2008 | Wongsenakhum et al. | |
| 2008/0081127 A1 | 4/2008 | Thompson et al. | |
| 2008/0081453 A1 | 4/2008 | Kim et al. | |
| 2008/0124926 A1 | 5/2008 | Chan et al. | |
| 2008/0254619 A1 | 10/2008 | Lin et al. | |
| 2008/0254623 A1 | 10/2008 | Chan et al. | |
| 2008/0280438 A1 | 11/2008 | Lai et al. | |
| 2008/0283844 A1 | 11/2008 | Hoshi et al. | |
| 2009/0045517 A1 | 2/2009 | Sugiura et al. | |
| 2009/0050937 A1 | 2/2009 | Murata et al. | |
| 2009/0053893 A1 | 2/2009 | Khandelwal et al. | |
| 2009/0057151 A1 | 3/2009 | Eugene et al. | |
| 2009/0149022 A1* | 6/2009 | Chan et al. | 438/660 |
| 2009/0160030 A1 | 6/2009 | Tuttle | |
| 2009/0163025 A1 | 6/2009 | Humayun et al. | |
| 2009/0315154 A1 | 12/2009 | Kirby et al. | |
| 2010/0035427 A1 | 2/2010 | Chan et al. | |
| 2010/0055904 A1 | 3/2010 | Chen et al. | |
| 2010/0062149 A1 | 3/2010 | Ma et al. | |
| 2010/0072623 A1 | 3/2010 | Prindle et al. | |
| 2010/0130002 A1 | 5/2010 | Dao et al. | |
| 2010/0130003 A1 | 5/2010 | Lin et al. | |
| 2010/0155846 A1 | 6/2010 | Mukherjee et al. | |
| 2010/0159694 A1 | 6/2010 | Chandrashekar et al. | |
| 2010/0244141 A1 | 9/2010 | Beyer et al. | |
| 2010/0244260 A1 | 9/2010 | Hinomura | |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |
| 2010/0330800 A1 | 12/2010 | Ivanov et al. | |
| 2011/0059608 A1* | 3/2011 | Gao | C23C 16/0272 438/654 |
| 2011/0156154 A1 | 6/2011 | Hoentschel et al. | |
| 2011/0221044 A1 | 9/2011 | Danek et al. | |
| 2011/0223763 A1 | 9/2011 | Chan et al. | |
| 2011/0233778 A1 | 9/2011 | Lee et al. | |
| 2011/0236594 A1 | 9/2011 | Haverkamp et al. | |
| 2012/0009785 A1 | 1/2012 | Chandrashekar et al. | |
| 2012/0015518 A1 | 1/2012 | Chandrashekar et al. | |
| 2012/0040530 A1 | 2/2012 | Humayun et al. | |
| 2012/0199887 A1 | 8/2012 | Chan et al. | |
| 2012/0225192 A1 | 9/2012 | Yudovsky et al. | |
| 2012/0231626 A1 | 9/2012 | Lee et al. | |
| 2012/0244699 A1 | 9/2012 | Khandelwal et al. | |
| 2012/0294874 A1 | 11/2012 | Macary et al. | |
| 2013/0043554 A1 | 2/2013 | Piper | |
| 2013/0062677 A1 | 3/2013 | Li et al. | |
| 2013/0109172 A1 | 5/2013 | Collins et al. | |
| 2013/0168864 A1 | 7/2013 | Lee et al. | |
| 2013/0171822 A1 | 7/2013 | Chandrashekar et al. | |
| 2013/0285195 A1 | 10/2013 | Piper | |
| 2013/0302980 A1 | 11/2013 | Chandrashekar et al. | |
| 2014/0011358 A1 | 1/2014 | Chen et al. | |
| 2014/0027664 A1 | 1/2014 | Wei et al. | |
| 2014/0030889 A1 | 1/2014 | Chen et al. | |
| 2014/0061931 A1 | 3/2014 | Kang | |
| 2014/0073135 A1 | 3/2014 | Guan et al. | |
| 2014/0154883 A1 | 6/2014 | Humayun et al. | |
| 2014/0162451 A1 | 6/2014 | Chen et al. | |
| 2014/0308812 A1 | 10/2014 | Arghavani et al. | |
| 2015/0037972 A1 | 2/2015 | Danek et al. | |
| 2015/0056803 A1 | 2/2015 | Chandrashekar et al. | |
| 2015/0279732 A1 | 10/2015 | Lee et al. | |

FOREIGN PATENT DOCUMENTS

| | | |
|---|---|---|
| EP | 0 437 110 | 7/1991 |
| EP | 1 156 132 | 11/2001 |
| EP | 1 179 838 | 2/2002 |
| JP | S5629648 A | 3/1981 |
| JP | 08-115984 | 5/1996 |
| JP | 09-027596 | 1/1997 |
| JP | H10-144688 | 5/1998 |
| JP | H10-163132 | 6/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-124488 | 4/2002 |
| JP | 2003-193233 | 7/2003 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-533877 | 9/2009 |
| JP | 2009-540123 | 11/2009 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 705936 | 4/2007 |
| KR | 10-2008-0036679 | 4/2008 |
| KR | 10-2008-0110897 | 12/2008 |
| KR | 10-2009-0103815 | 10/2009 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/090295 | 6/2013 |
| WO | WO 2013/148444 | 10/2013 |
| WO | WO 2013/148880 | 10/2013 |
| WO | WO 2014/058536 | 4/2014 |

OTHER PUBLICATIONS

U.S. Appl. No. 14/173,733, filed Feb. 5, 2014, entitled "Tungsten Nucleation Process to Enable Low Resistivity Tungsten Feature Fill."

U.S. Appl. No. 13/758,928, filed Feb. 4, 2013, entitled "Methods for Forming All Tungsten Contacts and Lines."

(56) References Cited

OTHER PUBLICATIONS

U.S. Appl. No. 14/097,160, filed Dec. 4, 2013, entitled "Methods for Depositing Ultra Thin Low Resistivity Tungsten Film for Small Critical Dimension Contacts and Interconnects."
U.S. Appl. No. 13/928,216, filed Jun. 26, 2013, entitled "Methods of Forming Tensile Tungsten Films and Compressive Tungsten Films."
US Office Action, dated Apr. 7, 2014, issued in U.S. Appl. No. 13/633,502.
US Office Action, dated Jul. 17, 2002, issued in U.S. Appl. No. 09/975,074.
US Notice of Allowance, dated Mar. 12, 2003, issued in U.S. Appl. No. 09/975,074.
US Office Action, dated Feb. 8, 2005, issued in U.S. Appl. No. 10/649,351.
US Final Office Action, dated Jul. 14, 2005, issued in U.S. Appl. No. 10/649,351.
US Office Action, dated Dec. 30, 2005, issued in U.S. Appl. No. 10/649,351.
US Notice of Allowance, dated Jul. 21, 2006, issued in U.S. Appl. No. 10/649,351.
US Office Action, dated Jun. 22, 2004, issued in U.S. Appl. No. 10/435,010.
US Notice of Allowance, dated Oct. 7, 2004, issued in U.S. Appl. No. 10/435,010.
US Notice of Allowance, dated Jan. 19, 2005, issued in U.S. Appl. No. 10/435,010.
US Office Action, dated Nov. 23, 2005, issued in U.S. Appl. No. 10/984,126.
US Final Office Action, dated May 17, 2006, issued in U.S. Appl. No. 10/984,126.
US Notice of Allowance, dated Aug. 25, 2006, issued in U.S. Appl. No. 10/984,126.
US Office Action, dated Mar. 23, 2005, issued in U.S. Appl. No. 10/690,492.
US Notice of Allowance, dated Sep. 14, 2005, issued in U.S. Appl. No. 10/690,492.
US Office Action, dated Jun. 27, 2008, issued in U.S. Appl. No. 11/305,368.
US Office Action, dated Apr. 3, 2009, issued in U.S. Appl. No. 11/305,368.
US Notice of Allowance, dated Nov. 17, 2009, issued in U.S. Appl. No. 11/305,368.
US Office Action, dated Jul. 12, 2005, issued in U.S. Appl. No. 10/815,560.
US Final Office Action, dated Dec. 28, 2005, issued in U.S. Appl. No. 10/815,560.
US Office Action, dated Apr. 17, 2006, issued in U.S. Appl. No. 10/815,560.
US Office Action, dated Sep. 28, 2006, issued in U.S. Appl. No. 10/815,560.
US Notice of Allowance,, dated Apr. 24, 2007, issued in U.S. Appl. No. 10/815,560.
US Office Action, dated Aug. 21, 2008, issued in U.S. Appl. No. 11/265,531.
US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.
US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19, 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.
US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16, 2012, issued in U.S. Appl. No. 13/276,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance, dated Jun. 7, 2013, issued in U.S. Appl. No. 12/202,126.
US Office Action, dated May 3, 2010, issued in U.S. Appl. No. 12/407,541.

(56) References Cited

OTHER PUBLICATIONS

US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.
US Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 18, 2013, issued in U.S. Appl. No. 12/723,532.
US Notice of Allowance dated Dec. 24, 2013, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013 issued in U.S. Appl. No. 12/755,259.
US Office Action, dated May 10, 2012, issued in U.S. Appl. No. 13/020,748.
US Final Office Action, dated Nov. 16, 2012, issued in U.S. Appl. No. 13/020,748.
US Office Action, dated Feb. 24, 2014, issued in U.S. Appl. No. 13/020,748.
US Office Action, dated Jun. 20, 2013, issued in U.S. Appl. No. 13/560,688.
US Final Office Action, dated Feb. 14, 2014, issued in U.S. Appl. No. 13/560,688.
US Office Action, dated Jun. 14, 2013, issued in U.S. Appl. No. 13/633,798.
US Final Office Action, dated Nov. 26, 2013, issued in U.S. Appl. No. 13/633,798.
PCT Search Report and Written Opinion, dated Jan. 19, 2005, issued in PCT/US2004/006940.
Korean First Notification of Provisional Rejection, dated Dec. 8, 2010, issued in Application No. 2004-0036346.
Korean Office Action, dated Jun. 13, 2011, issued in Application No. 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. 200980133560.1.
Chinese Second Office Action dated Aug. 7, 2013 issued in Application No. 200980133560.1.
Japanese Office Action dated Dec. 3, 2013 issued in Application No. 2011-525228.
Korean Office Action dated Sep. 6, 2012 issued in Application No. 2011-7004322.
Korean Office Action dated Jul. 19, 2013 issued in Application No. 2011-7004322.
Korean Office Action dated Nov. 4, 2013 issued in Application No. 10-2013-7027117.
Korean Office Action dated Mar. 21, 2013 issued in KR Application No. 10-2010-0024905.
Japanese Office Action dated Mar. 4, 2014 issued in JP 2010-093522.
Korean Notification of Provisional Rejection dated Jul. 17, 2012, issued in Application No. 2010-0087997.
Korean Office Action dated Mar. 4, 2013 in KR Application No. 2010-0035449.
Korean Second Office Action dated Jan. 25, 2014 in KR Application No. 10-2010-0035453.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
Becker, Jill (Apr. 7, 2003) "Diffusion barrier properties of tungsten nitride films grown by atomic layer deposition from bis(tert-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.
Collins et al. (Jan. 21, 2003) "Pulsed Deposition of Ultra Thin Tungsten for Plugfill of High Aspect Ratio Contacts," Semiconductor Equipment and Materials International, Semicon Korea, 3 pages.
Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).
Elam et al. (2001) "Nucleation and Growth During Tungsten Atomic Layer Deposition on $SiO_2$ Surfaces," *Thin Solid Films*, 13pp.
Fair, James A. (1983) Presentation by Inventor "Chemical Vapor Deposition of Refractory Metal Silicides," *GENUS Incorporated*, 27 pp.
George et al. (1996) "Surface Chemistry for atomic Layer Growth", *J. Phys. Chem*, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/c/pdf3/43/07/1585.pdf.], *Materials Transactions*, 43(7):1585-1592.
Hoover, Cynthia (Jul. 2007) "Enabling Materials for Contact Metallization," *Praxair Electronic Materials R&D*, pp. 1-16.
Klaus et al. (2000) "Atomic layer deposition of tungsten using sequential surface chemistry with a sacrificial stripping reaction," *Thin Solid Films* 360:145-153.
Klaus et al. (2000) "Atomically Controlled Growth of Tungsten and Tungsten Nitride Using Sequential Surface Reactions," *Applied Surface Science*, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.
Lai, Ken K. and Lamb, H. Henry (1995) "Precursors for Organometallic Chemical Vapor Deposition of Tungsten Carbide Films," *Chemistry Material*, 7(12):2284-2292.

(56) References Cited

OTHER PUBLICATIONS

Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of $WN_xC_y$ Thin Films by ALCVD™ Method for Diffusion Barriers in Metallization," *IITC Conference Report*, 3 pp.
Saito et al. (2001) "A Novel Copper Interconnection Technology Using Self Aligned Metal Capping Method," *IEEE*, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.
US Final Office Action, dated Nov. 5, 2014, issued in U.S. Appl. No. 13/633,502.
US Notice of Allowance, dated Mar. 2, 2015, issued in U.S. Appl. No. 13/633,502.
US Notice of Allowance (Supplemental Notice of Allowability), dated Apr. 16, 2015, issued in U.S. Appl. No. 13/633,502.
US Office Action, dated May 30, 2014, issued in U.S. Appl. No. 13/862,048.
US Final Office Action, dated Oct. 16, 2014, issued in U.S. Appl. No. 13/862,048.
US Notice of Allowance, dated Apr. 28, 2015, issued in U.S. Appl. No. 13/862,048.
US Office Action, dated Dec. 11, 2014, issued in U.S. Appl. No. 14/173,733.
US Office Action, dated Dec. 18, 2014, issued in U.S. Appl. No. 14/097,160.
US Final Office Action, dated Jul. 2, 2014, issued in U.S. Appl. No. 13/020,748.
US Office Action, dated Jan. 15, 2015, issued in U.S. Appl. No. 13/774,350.
US Office Action, dated Dec. 23, 2014, issued in U.S. Appl. No. 13/851,885.
US Office Action, dated Dec. 18, 2014, issued in U.S. Appl. No. 14/502,817.
US Office Action, dated Sep. 18, 2014, issued in U.S. Appl. No. 13/928,216.
US Notice of Allowance, dated Jan. 22, 2015, issued in U.S. Appl. No. 13/928,216.
US Notice of Allowance, dated Nov. 4, 2014, issued in U.S. Appl. No. 13/560,688.
US Notice of Allowance, dated May 23, 2014, issued in U.S. Appl. No. 13/633,798.
Chinese Third Office Action dated Apr. 22, 2014 issued in Application No. 200980133560.1.
Chinese Fourth Office Action dated Jan. 5, 2015 issued in Application No. 200980133560.1.
Korean Office Action dated Jun. 17, 2014 issued in Application No. 10-2013-7027117.
Japanese Office Action dated Jun. 17, 2014 issued in Application No. JP 2010-055163.
Taiwan Office Action and Search Report dated Feb. 12, 2015 issued in TW 099130354.
Taiwan Office Action dated Dec. 27, 2014 issued in TW 099111860.
Japanese Office Action dated Jul. 29, 2014 issued in JP 2010-093544.
PCT International Preliminary Report on Patentability and Written Opinion, dated Oct. 9, 2014, issued in PCT/US2013/033174.
PCT International Preliminary Report on Patentability and Written Opinion, dated Oct. 9, 2014, issued in PCT/US2013/034167.
Manik. P, et al. (2012) "Fermi-level unpinning and low resistivity in contacts to n-type Ge with a thin ZnO interfacial layer," *App. Phys. Lett.* 101:182105-5.
U.S. Appl. No. 14/738,685, filed Jun. 12, 2015, entitled "Method for Producing Ultra-Thin Tungsten Layers With Improved Step Coverage."
U.S. Appl. No. 14/723,270, filed May 27, 2015, entitled "Deposition of Low Fluorine Tungsten by Sequential CVD Process."
US Notice of Allowance, dated Jun. 17, 2015, issued in U.S. Appl. No. 13/862,048.
US Notice of Allowance, dated Jun. 2, 2015, issued in U.S. Appl. No. 14/173,733.
US Final Office Action, dated Jun. 2, 2015, issued in U.S. Appl. No. 14/097,160.
US Final Office Action, dated Jul. 17, 2015, issued in U.S. Appl. No. 14/502,817.
US Office Action, dated May 29, 2015, issued in U.S. Appl. No. 13/949,092.
Chinese Fifth Office Action dated May 5, 2015 issued in Application No. 200980133560.1.
Taiwan Office Action dated Jun. 8, 2015 issued in TW 099107504.
Korean First Office Action dated Jul. 10, 2015 issued in KR Application No. 10-2014-0090283.
US Notice of Allowance, dated Sep. 9, 2015, issued in U.S. Appl. No. 14/097,160.
US Office Action, dated Oct. 8, 2015, issued in U.S. Appl. No. 13/774,350.
US Notice of Allowance, dated Sep. 25, 2015, issued in U.S. Appl. No. 14/502,817.
Taiwan Office Action dated Aug. 4, 2015 issued in TW Application No. 099111859.
Chinese Office Action [no translation] dated Sep. 6, 2015 issued in CN 201310320848.8.
U.S. Appl. No. 15/040,561, filed Feb. 10, 2016, entitled "Tungsten for Wordline Applications."
U.S. Appl. No. 14/989,444, filed Jan. 6, 2016, entitled "Low Tempature Tungsten Film Deposition for Small Critical Dimension Contacts and Interconnects."
U.S. Appl. No. 14/965,806, filed Dec. 10, 2015, entitled "Tungsten Feature Fill."
US Office Action, dated Jan. 12, 2016, issued in U.S. Appl. No. 14/738,685.
US Final Office Action, dated Jan. 14, 2016, issued in U.S. Appl. No. 13/949,092.
Taiwan Office Action (Rejection Decision) dated Oct. 28, 2015 issued in Application No. TW 099130354.
Chinese Office Action [no translation] dated Feb. 26, 2016, issued in CN 201380022648.2.
Chinese First Office Action dated Mar. 18, 2016 issued in Application No. CN 201380022693.8.

\* cited by examiner

METHOD FOR DEPOSITING EXTREMELY LOW RESISTIVITY TUNGSTEN

BACKGROUND

Tungsten film deposition using chemical vapor deposition techniques is an integral part of semiconductor fabrication processes. Tungsten films may be used as low resistivity electrical connections in the form of horizontal interconnects, vias between adjacent metal layers, and contacts between a first metal layer and the devices on a silicon substrate. In a conventional tungsten deposition process, a barrier layer is deposited on a dielectric substrate, followed by deposition of a nucleation or seed layer of tungsten film. Thereafter, the remainder of the tungsten film is deposited on the nucleation layer as a bulk layer. Conventionally, the tungsten bulk layer is formed by the reduction of tungsten hexafluoride ($WF_6$) with hydrogen ($H_2$) in a chemical vapor deposition (CVD) process.

As semiconductor devices scale to smaller and smaller technology nodes, shrinking contact and via dimensions make CVD of tungsten more challenging. Increasing aspect ratios can lead to voids or large seams within device features, resulting in lower yields and decreased performance in microprocessor and memory chips. Void-free fill in high aspect ratio features of 10:1, 20:1 or greater is difficult using conventional CVD tungsten deposition techniques.

SUMMARY

Provided are methods of depositing low resistivity tungsten on a semiconductor substrate.

In one aspect, a method of forming a tungsten film on a substrate is provided. The method includes providing the substrate with a nitride layer, annealing the nitride layer, and depositing tungsten on the nitride layer to form the tungsten film such that the nitride layer is annealed before tungsten is deposited. In various embodiments, the nitride layer is a titanium nitride layer or a tungsten nitride layer. In some embodiments, the titanium nitride film is annealed at a temperature between about 385° C. and about 445° C. In many embodiments, argon gas is flowed during annealing. The tungsten may be deposited by chemical vapor deposition. In various embodiments, the nitride layer may be annealed at conditions to change the grain structure of the nitride layer.

Another aspect is a method of forming tungsten film by annealing a nitride film on a substrate, depositing bulk tungsten on the nitride film to form the tungsten film, and annealing the tungsten film. In some embodiments, the method also includes depositing a tungsten nucleation layer on the nitride film after annealing the nitride film, and annealing the tungsten nucleation layer before depositing the bulk tungsten. In various embodiments, the nucleation layer is annealed at a temperature between about 385° C. and about 445°. In various embodiments, the tungsten film is annealed for no more than 1 minute. The annealing pressure may be at least 1 Torr.

Another aspect is a method of forming a tungsten film on a substrate in a reaction chamber. The method includes depositing tungsten on the substrate to form the tungsten film and annealing the tungsten film to thereby lower the resistivity at a chamber pressure of at least about 1 Torr. In various embodiments, the tungsten film is annealed at a temperature between about 385° C. and about 445° C. In many embodiments, boron is used during deposition of the tungsten film, and the tungsten film has a boron content of less than about 1%. In many embodiments, the tungsten film is annealed for a duration between about 1 second and about 10 minutes.

Another aspect is a method of forming a tungsten film on a substrate in a reaction chamber. The method may involve depositing tungsten on the substrate to form the tungsten film at a deposition pressure and annealing the tungsten film to thereby lower the resistivity at the deposition pressure.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

There are various challenges in tungsten (W) fill as devices scale to smaller technology nodes. One challenge is preventing an increase in resistance due to the thinner films in contacts and vias. As features become smaller, the tungsten contact or line resistance increases due to scattering effects in the thinner tungsten film. Conventional chemical vapor deposition (CVD) tungsten deposition processes involve depositing a barrier layer of titanium nitride (TiN), followed by nucleation deposition, and then a CVD bulk tungsten deposition. While efficient tungsten deposition processes use tungsten nucleation layers, these layers typically have higher electrical resistivities than the bulk layers. As features become smaller, low resistivity tungsten films minimize power losses and overheating in integrated circuit designs. The thin barrier and tungsten nucleation films, which have higher resistivity, occupy a larger percentage of the smaller features.

Figure 1:
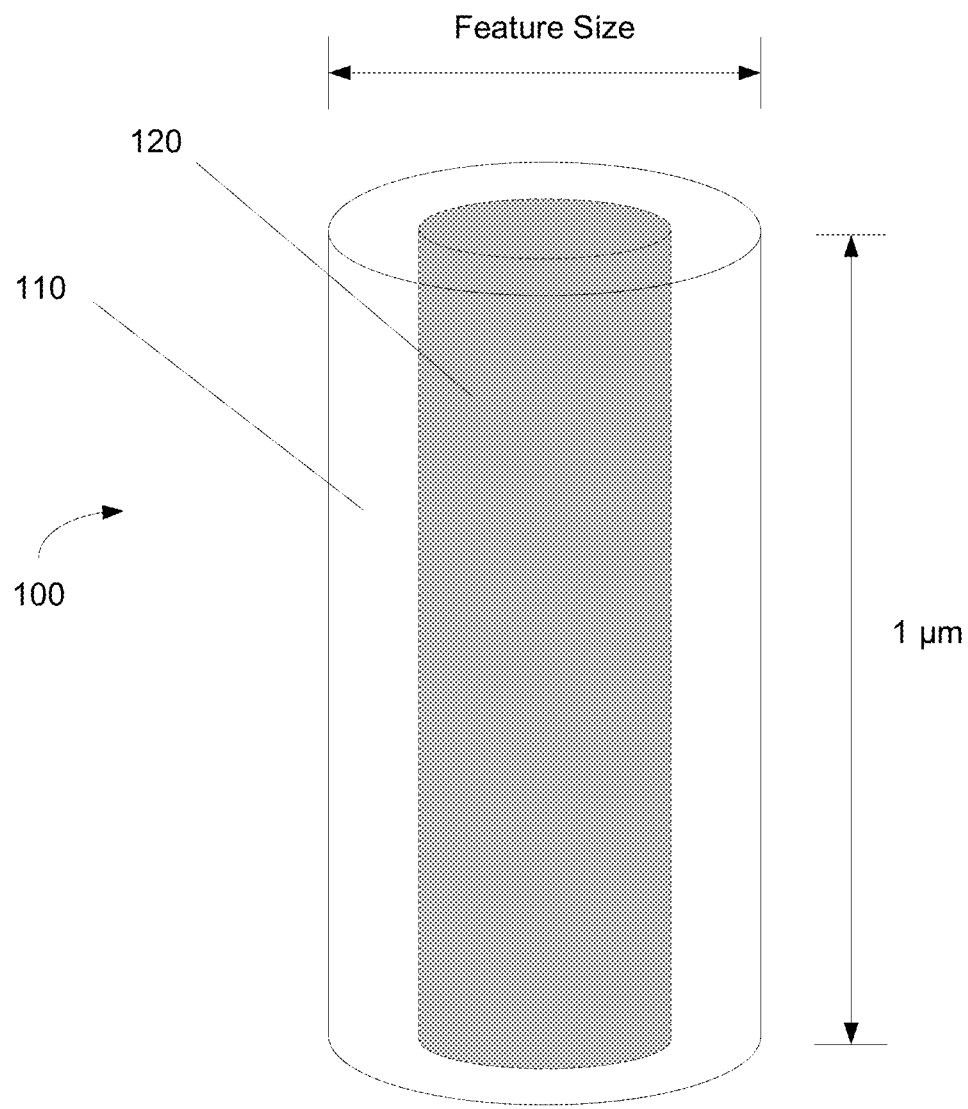
FIG. 1 is a schematic illustration of a feature filled with tungsten nucleation and bulk layers according to certain embodiments.

FIG. 1 shows a volume occupied by a nucleation film 110 and a bulk tungsten material 120 in a via or contact structure 100. Because the resistivity of the nucleation layer is higher than that of the bulk layer ($\rho_{nucleation} > \rho_{bulk}$) the thickness of the nucleation layer should be minimized to keep the total resistance as low as possible. On the other hand, the tungsten nucleation should be sufficiently thick to fully cover the underlying substrate to support high quality bulk deposition. Resistivity of a tungsten film depends on the thickness of the film deposited. For example, conventional methods may yield a 50 Å tungsten film with a resistivity of 60 μΩ-cm. In another example, conventional methods may yield a 100 Å film with a resistivity of 30 μΩ-cm.

Provided herein are methods of depositing extremely low resistivity thin tungsten films on substrates. Methods involve annealing layers during certain times of the deposition process at various conditions. Resulting tungsten films in accordance with the disclosed embodiments have resistivities up to 20% lower than conventionally deposited tungsten films.

According to various implementations, annealing may occur after deposition of a layer in a separate annealing chamber, or may occur in a deposition chamber altered to accommodate annealing methods. In some implementations, annealing operations may be conducted with an air break between deposition of a layer and a subsequent annealing, typically without processing operations, without negative effects on the tungsten deposition or resistivity. An air break may last between about 1 second and about 12 hours. An air break can allow annealing operations to be performed in different tools than previous or subsequent deposition or other processing operations, as the substrate does not have to be kept under vacuum.

In some implementations, annealing is performed prior to the deposition of tungsten. In some implementations, annealing is performed after deposition of tungsten. In some implementations, annealing is performed both before and after the deposition of tungsten. Also, in some implementations, annealing can be performed after deposition of a nucleation layer of tungsten. As discussed further below, these aspects result in tungsten films having improved resistivity.

According to various embodiments, the methods described herein may be used to deposit tungsten in a feature formed in a substrate. Such a feature may have an aspect ratio of at least 10:1, at least 15:1, at least 20:1, at least 25:1, or at least 30:1. The feature size can be characterized by the feature opening size in addition to or instead of the aspect ratio. The opening may be from about 10 nm to about 100 nm wide in some embodiments. For example, in certain embodiments, the methods may be advantageously used with features having narrow openings, regardless of the aspect ratio. The methods may further be advantageously used to deposit tungsten in larger and/or smaller aspect ratio features, as well to deposit blanket or planar tungsten layers.

In certain embodiments, a recessed feature is formed within a dielectric layer on a substrate, with the bottom of the feature providing contact to an underlying metal layer. Also in certain embodiments, the feature includes a liner layer such as a diffusion barrier layer on its sidewalls and/or bottom. Examples of liner layers include titanium nitride (TiN) layers including titanium/titanium nitride (Ti/TiN), and tungsten nitride (WN). In additional to or instead of diffusion barrier layers, the feature may include layers such as an adhesion layer, a nucleation layer, a combination thereof, or any other applicable material lining the sidewalls and the bottom of the feature.

In certain embodiments, the feature is a re-entrant feature; with a liner layer or other material forming an overhang that partially blocks the feature opening. Because many deposition processes do not have good step coverage properties and result in more material being deposited on the field region and near the opening than inside the feature, a liner layer may be thicker near the opening than inside the feature. For the purposes of this description, "near the opening" is defined as an approximate position or an area within the feature (i.e., along the side wall of the feature) corresponding to between about 0% and about 10% of the feature depth measured from the field region. In certain embodiments, the area near the opening corresponds to the area at the opening. Further, "inside the feature" is defined as an approximate position or an area within the feature corresponding to between about 20% and about 60% of the feature depth measured from the field region on the top of the feature. Typically, when values for certain parameters (e.g., thicknesses) are specified "near the opening" or "inside the feature," these values represent a measurement or an average of multiple measurements taken within these positions/areas. In certain embodiments, an average thickness of an underlayer near the opening is at least about 10% greater than that inside the feature. In more specific embodiments, this difference may be at least about 25%, at least about 50%, or at least about 100%. Distribution of a material within a feature may also be characterized by its step coverage. For the purposes of this description, "step coverage" is defined as a ratio of two thicknesses, i.e., thickness of the material inside the feature divided by the thickness of the material near the opening. In certain examples, the step coverage of the liner or other underlayer is less than about 100% or, more specifically, less than about 75% or even less than about 50%.

Embodiments described herein may involve deposition of tungsten nucleation layers and/or bulk layers for features. For context, a description of methods of depositing tungsten nucleation layers and bulk layers that may be used in methods of the present disclosure is provided below. It should be noted however, that other methods of nucleation and/or bulk layer deposition may also be used.

A tungsten nucleation layer may be deposited in a feature to conformally coat the sidewalls and bottom of the feature. In general, a nucleation layer is a thin conformal layer that serves to facilitate the subsequent formation of a bulk material thereon. Conforming to the underlying feature bottom and sidewalls can be critical to support high quality deposition. Various processes may be used to form the nucleation layer, including but not limited to, CVD processes, physical vapor deposition (PVD) processes, atomic layer deposition (ALD) processes, and pulsed nucleation layer (PNL) deposition processes.

In a PNL technique, pulses of reactant are sequentially injected and purged from the reaction chamber, typically by a pulse of a purge gas between reactants. A first reactant is typically adsorbed onto the substrate, available to react with the next reactant. The process is repeated in a cyclical fashion until the desired thickness is achieved. PNL is similar to ALD techniques. PNL is generally distinguished from ALD by its higher operating pressure range (greater than 1 Torr) and its higher growth rate per cycle (greater than 1 monolayer film growth per cycle). Chamber pressure during PNL deposition may range from about 1 Torr to about 400 Torr. In the context of the description provided herein, PNL broadly embodies any cyclical process of sequentially adding reactants for reaction on a semiconductor substrate. Thus, the concept embodies techniques conventionally referred to as ALD. In the context of the disclosed embodiments, CVD embodies processes in which reactants are together introduced to a reactor for a vapor-phase reaction. PNL and ALD processes are distinct from CVD processes and vice versa.

Forming a nucleation layer using one or more PNL cycles is discussed in U.S. Pat. Nos. 6,844,258; 7,005,372; 7,141,494; 7,262,125; 7,589,017; 7,772,114; 7,955,972; and 8,058,170, all of which are incorporated herein by this reference. These PNL deposition processes involve exposing a substrate to various sequences of reducing agents and tungsten precursors to grow a nucleation layer of the desired thickness. A combined PNL-CVD method of depositing a nucleation layer is described in U.S. Pat. No. 7,655,567, also incorporated herein by reference.

Nucleation layer thickness can be enough to support high quality deposition. In certain embodiments, the requisite thickness depends in part on the nucleation layer deposition method. A PNL method providing near 100% step coverage with nucleation film thicknesses as low as about 12 Å (as compared to typical nucleation films of 50 Å) may be used in certain embodiments. Regardless of the method used to deposit the nucleation layer, however, in some embodiments a low temperature CVD operation used to fill the feature can afford use of thinner nucleation layers than required by conventional higher temperature CVD. Without being bound by a particular theory, it is believed that this may be because the lower chemistry at the reduced temperatures improves growth even on the nucleation sites that are not fully developed. See, e.g., U.S. Patent Publication No. 2010/0267235, incorporated by reference herein. According to various embodiments, nucleation layers may be formed as low as between about 10 Å and about 15 Å.

In certain embodiments, nucleation layer deposition is followed by a post-deposition treatment operation to improve resistivity. Such treatment operations are described further below and in more detail in U.S. Pat. Nos. 7,772,114 and 8,058,170, both of which are incorporated by reference herein.

CVD deposition can then occur on the nucleation layer. CVD deposition of a bulk layer can involve flowing a tungsten-containing precursor and a co-reactant such as a reducing agent, if appropriate, into a deposition chamber. An inert carrier gas may be used to deliver one or more of the reactant streams, which may or may not be pre-mixed. Unlike PNL or ALD processes, this operation generally involves flowing the reactants continuously until the desired amount is deposited. In certain embodiments, the CVD operation may take place in multiple stages, with multiple periods of continuous and simultaneous flow of reactants separated by periods of one or more diverted reactant flows. Flows may also be pulsed for a pulse time between about 1 second and about 2 seconds. Chamber pressure during CVD deposition may range from about 40 Torr to about 500 Torr.

Example substrate temperatures are as low as 250° C. and may be as high as 495° C. during the CVD reaction. Various tungsten-containing gases including, but not limited to, $WF_6$, tungsten chloride ($WCl_6$), and tungsten hexacarbonyl $W(CO)_6$, can be used as the tungsten-containing precursor.

In certain embodiments, the tungsten-containing precursor is a halogen-containing compound, such as $WF_6$. In certain embodiments, the reducing agent is hydrogen gas, though other reducing agents may be used, including silane ($SiH_4$), disilane ($Si_2H_6$), hydrazine ($N_2H_4$), diborane ($B_2H_6$), and germane ($GeH_4$). In some embodiments, CVD may be implemented in various stages, such as a low temperature stage and a high temperature stage. Still further, nitrogen may be pulsed during CVD deposition of a bulk layer as described in U.S. Pat. No. 8,551,885 and U.S. patent application Ser. No. 13/633,798, both of which are incorporated by reference herein.

Figure 2:
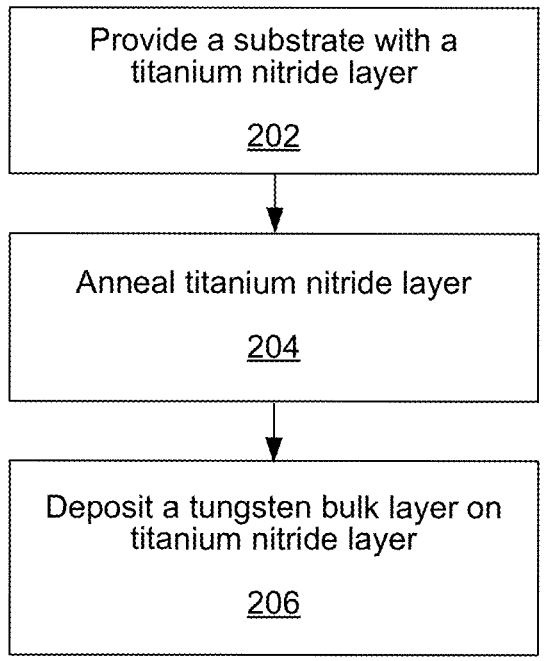
FIG. 2 is a process flow diagram for depositing tungsten in accordance with various embodiments.

FIG. 2 provides a process flow diagram for depositing a tungsten film in which a titanium nitride underlayer is annealed. Method 200 involves operation 202 of providing a substrate with a titanium nitride layer thereon. The titanium nitride layer may be conformal to a high aspect ratio feature formed in the substrate. Example thicknesses of the titanium nitride layer may be between about 30 Å and about 300 Å thick. The titanium nitride layer may be an ALD-deposited layer, or a PVD-deposited layer, or CVD-deposited layer, in some implementations. It should be noted that annealing titanium nitride layers has been shown to be improved for both ALD-layers and PVD-deposited layers. This indicates that the annealing lowers resistivity by an effect other than or in addition to removing various impurities that might be incorporated into a film depending on the deposition (e.g., removing chloride in a titanium nitride film deposited from titanium chloride). Such an effect is discussed further below with respect to FIG. 12.

Next, in operation 204, the titanium nitride layer is annealed. Annealing can involve flowing an inert gas at a high temperature for a time range as desired. Examples of gases include argon (Ar), hydrogen ($H_2$), and combinations thereof. In various embodiments, a mixture of argon (Ar) and hydrogen ($H_2$) is used. In many embodiments, only argon (Ar) is flowed. In some embodiments, an optional nitrogen-based gas, such as nitrogen ($N_2$) or ammonia ($NH_3$), is flowed as an inert gas. Substrate temperature may be higher than the temperature during deposition (such as ALD, CVD, or PVD). In various embodiments, substrate temperature may be as high as a temperature where crystal reorganization of the titanium nitride layer occurs. Low resistivity films may also be achieved at relatively low temperatures, such as at a substrate temperature of less than about 500° C., or less than about 450° C. As an example, substrate temperature may vary from about 385° C. to about 445° C.

In various embodiments, the pressure of the station or chamber may be between about 1 mTorr to about 760 Torr. In some examples, the pressure of the station or chamber may be between about 1 Torr and about 100 Torr. In some embodiments, the pressure of the station or chamber may be at least about 1 Torr. In some embodiments, the pressure may be the same as the pressure during ALD, PVD, or CVD of the titanium nitride layer.

In various embodiments, the annealing step may last about 1 second to about 10 minutes. In some embodiments, the annealing step may last between about 1 second and about 20 seconds.

As discussed further below, with reference to FIGS. 7, 8A, 8B, 9, 13A, and 13B, it has been found that annealing a TiN layer prior to deposition of a tungsten film lowers resistivity of a subsequently deposited tungsten film. Without being bound to a particular theory, it is believed that annealing the titanium nitride layer rearranges the orientation of molecules in the layer, thereby providing a preferential growth surface for nucleation of tungsten in the subsequent step. Annealing the titanium nitride layer does not change the chemical composition and does not result in formation of a silicide layer. The texture of the titanium nitride barrier layer may also be different and improved to allow better nucleation of tungsten. Better nucleation results in better adhesion to the surface, thereby reducing the resistivity and providing a smoother, more uniform tungsten layer. Further, while FIG. 2 refers to TiN underlayers, it is believed that anneals of other underlayers, including nitrides such as WN, may have similar advantages.

In operation 206, a tungsten bulk layer is deposited on the substrate by CVD. According to various embodiments, operation 206 is preceded by deposition of a tungsten nucleation as described above. In some embodiments, another annealing operation may occur after nucleation of the tungsten but before bulk deposition of the tungsten layer, using any of the conditions discussed above with respect to operation 204.

In certain embodiments, transitioning from operation 204 to 206, involves moving the substrate from one deposition station to another, which may occur in a multi-station chamber. Each of operation 204 and operation 206 may be performed in the same or different chamber. If performed in the same chamber, they each may be performed in the same or different stations of the same multi-station chamber or in a single station chamber. Also, operation 204 may be performed outside of a deposition chamber in a separate chamber that may or may not be in the same vacuum environment that operation 206 is performed.

Figure 3:
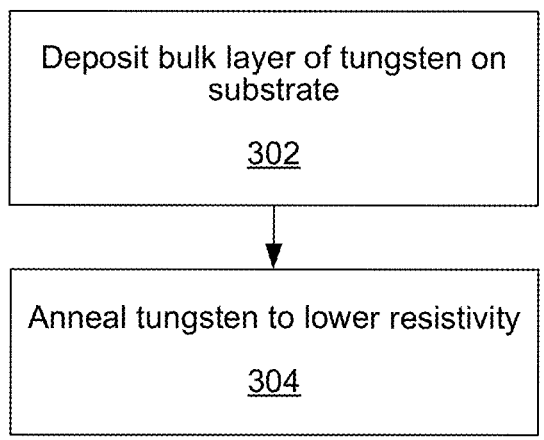
FIG. 3 is a process flow diagram for depositing tungsten in accordance with various embodiments.

FIG. 3 provides a process flow diagram for depositing tungsten in another embodiment. In method 300, a tungsten bulk layer is deposited in operation 302. Methods of deposition may be any of those discussed above. Next, in operation 304, the tungsten layer is annealed to lower resistivity. Annealing conditions may be any of the ones previously discussed with respect to FIG. 2, except that a non-nitrogen atmosphere may be used during anneal. In general, while it may remove some impurities from the tungsten layer, the anneal operation does not change the chemical composition of the tungsten layer. Accordingly, nitrogen-containing or silicon-containing atmospheres may be avoided to prevent formation of a nitride or silicide layer.

Example resistivities are about 41 µΩ-cm for a 60 Å layer of tungsten, or about 26 µΩ-cm for a 110 Å layer of tungsten. Percentage decrease in resistivity as compared to non-annealed tungsten layers may be between about 5% and about 35%.

Each of operation 302 and operation 304 may be performed in a different station of the same multi-station chamber, or in the same station of a single or multi-station chamber. Still further, they may be performed in different chambers, which may or may not be part of the same vacuum environment.

In embodiments in which a single station is used to perform operations 302 and 304, transitioning from operation 302 to 304 may involve shutting off a flow of tungsten precursor (operationally allowing hydrogen or other reducing gas and/or carrier gas to run), while raising the substrate temperature.

Figure 4:
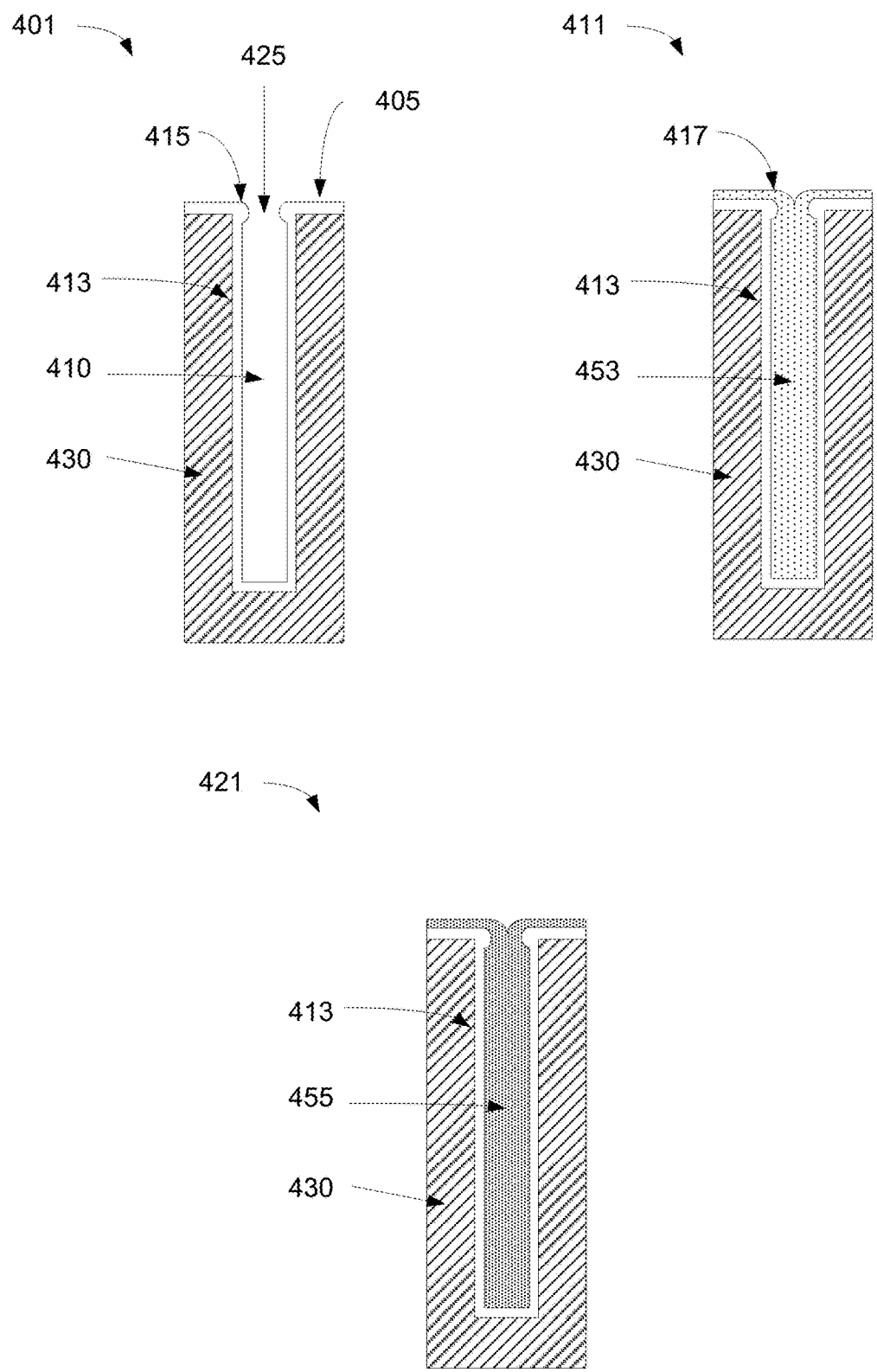
FIG. 4 depicts schematic illustrations of feature cross-sections at various stages of a process according to certain embodiments.

FIG. 4 illustrates schematic representations of one example of a feature's cross-sections at different stages of a filling process in which a CVD layer is deposited and annealed. Cross-section 401 represents an example of the feature 410 prior to any tungsten deposition. In this example, the feature 410 is formed in a dielectric layer 430, has an opening 425 at the top surface 405 of the substrate and includes a liner layer 413, such as a TiN layer. In certain embodiments, the size of the cavity near the opening 425 is narrower than inside the feature, for example, due to overhang 415 of the liner layer 413 as depicted in FIG. 4.

Cross-section 411 depicts the feature after CVD is performed to fill the feature with bulk layer. Note that the figure does not depict a nucleation layer. In certain embodiments, CVD is performed until at least the feature corner 417 (the point at which the substrate transitions from a planar region to the recessed feature) is covered with CVD tungsten. As further discussed below, the CVD tungsten followed by an anneal step has low resistivity, resulting in an excellent tungsten plug.

Cross-section 421 represents the feature after CVD is performed and after annealing to result in an annealed CVD tungsten layer 455. Without being bound by a particular theory, it is believed that annealing at high temperature after deposition of tungsten on the substrate results in purification of impurities from the tungsten film. For example, the annealing step may be releasing boron from the tungsten film, resulting in a tungsten film with less atomic boron content and lower resistivity overall.

Figure 5:
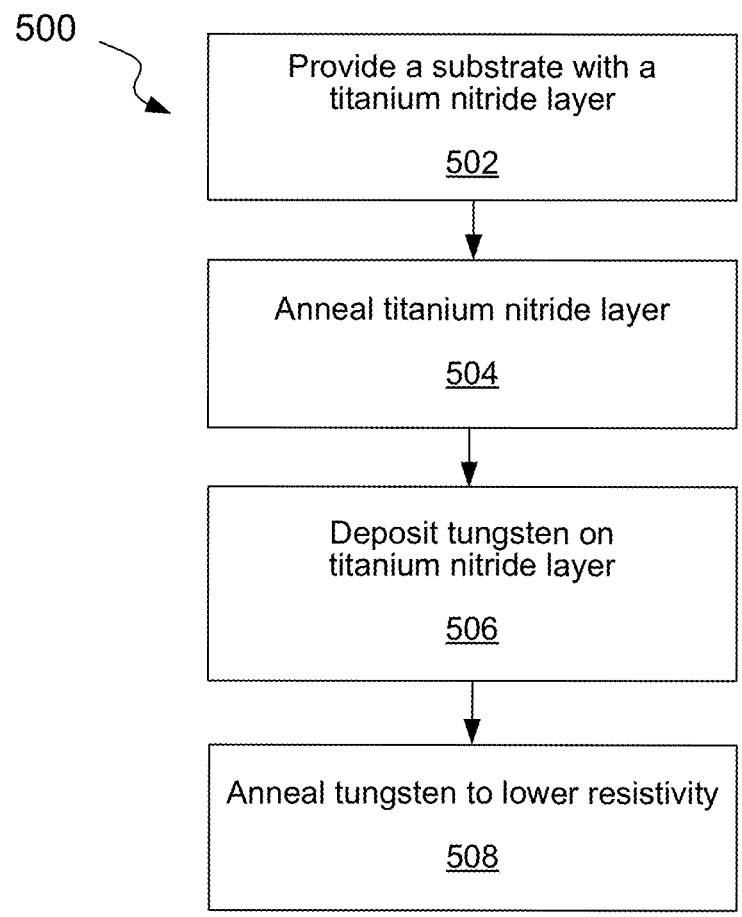
FIG. 5 is a process flow diagram for depositing tungsten in accordance with various embodiments.

FIG. 5 provides a process flow diagram showing steps for depositing a layer of tungsten including annealing prior to and after bulk tungsten deposition. In method 500, in operation 502, a layer of titanium nitride is deposited on the substrate. Methods of deposition and conditions of deposition may be any of those discussed with respect to FIG. 2. In operation 504, the titanium nitride layer is annealed. Any of the annealing conditions with respect to FIG. 2 may be used here. Next, in operation 506, a bulk tungsten layer is deposited. Conditions and methods of depositing the tungsten layer may be any of those discussed above with respect to FIG. 3. During this operation, an optional nucleation layer may be deposited prior to depositing bulk tungsten. The nucleation layer may also be annealed as discussed with respect to FIG. 2. Lastly, in operation 508, the bulk tungsten layer is annealed. In this operation, conditions may be any of those discussed with respect to FIG. 2, except that a non-nitrogen atmosphere may be used during the anneal. In this method, both a pre-tungsten deposition annealing step and post-tungsten deposition annealing step are implemented. As indicated above, while it may remove some impurities from the tungsten layer, the anneal operation does not change the chemical composition of the tungsten layer. Accordingly, nitrogen-containing or silicon-containing atmospheres may be avoided to prevent formation of a nitride or silicide layer In certain embodiments, transitioning from operation 504 to 506, or 506 to 508, involves moving the substrate from one deposition station to another, which may occur in a multi-station chamber. Each of these operations may be performed in the same or different chamber. If performed in the same chamber, they each may be performed in the same or different stations of the same multi-station chamber or in a single station chamber. Also, the anneal operations may be performed outside of a deposition chamber in a separate chamber that may or may not be in the same vacuum environment that the deposition operation is performed.

In alternative embodiments in which a single station is used to perform operations 506 and 508, transitioning from operation 506 to 508 may involve shutting off a flow of tungsten precursor (operationally allowing hydrogen or other reducing gas and/or carrier gas to run), while raising the substrate temperature. Once the substrate temperature is stabilized, the tungsten precursor and other gases, if necessary, are flowed into the reaction chamber for a high temperature deposition.

Apparatus

Methods of the disclosed embodiments may be carried out in various types of deposition apparatuses available from various vendors. Examples of suitable apparatuses include a Lam Concept 1 Altus, a Concept 2 Altus, a Concept 2 Altus-S, a Concept 3 Altus deposition system, or any of a variety of other commercially available CVD tools. In some cases, processes may be performed on multiple depositions stations sequentially. In some embodiments, the annealing step is performed at a station that is one of two, four, five, or even more deposition stations positioned within a single deposition chamber. In some embodiments, the annealing step is performed at a station on another chamber separate from the deposition chamber used for CVD. In various embodiments, an existing deposition station may be modified to accommodate an annealing step. One or more stations in a chamber may be used to perform CVD, or two or more stations may be used to perform CVD in a parallel processing.

Figure 6:
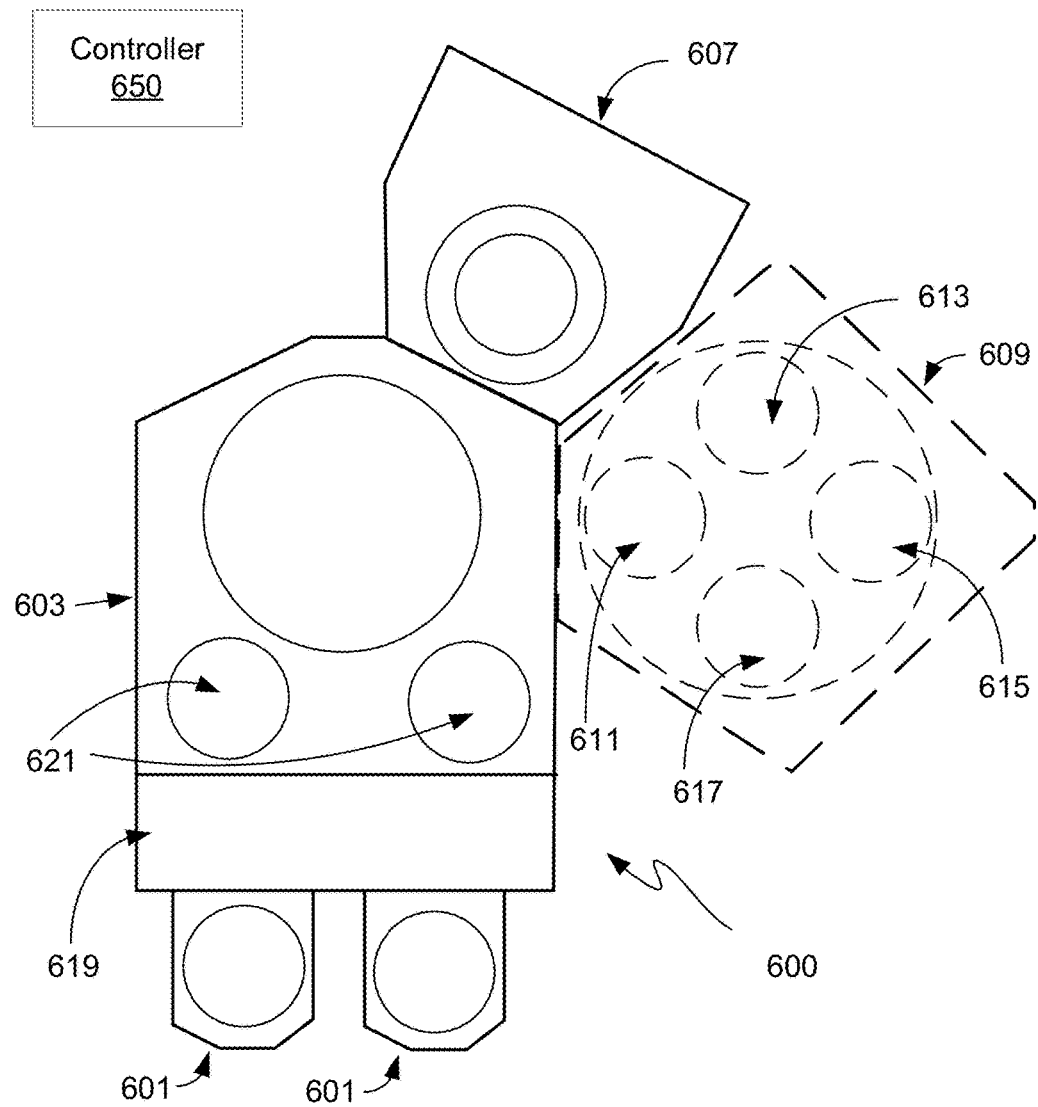
FIG. 6 shows a block diagram of a processing system for practicing methods in accordance with the disclosed embodiments.

FIG. 6 is a block diagram of a processing system suitable for conducting tungsten thin film deposition processes in accordance with disclosed embodiments. System 600 includes a transfer module 603, which provides a clean, pressurized environment to minimize the risk of contamination of substrates being processed as they are moved between various reactor modules. Mounted on the transfer module 603 is a multi-station reactor 609 capable of performing pulsed nucleation layer (PNL) deposition, multi-pulse treatment if desired, CVD, and annealing steps according to the disclosed embodiments. Chamber 609 may include multiple stations 611, 613, 615, and 617 that may sequentially perform these operations. For example, chamber 609 could be configured such that station 611 performs PNL deposition, station 613 performs multi-pulse treatment, station 615 performs CVD, and station 617 performs annealing.

Also mounted on the transfer module 603 may be one or more single or multi-station modules 607 capable of performing plasma or chemical (non-plasma) pre-cleans. The module may also be used for various other treatments, e.g., titanium nitride barrier layer deposition or post-liner tungsten nitride treatments. Still further, a module 607 may be an anneal module. The system 600 also includes one or more wafer source modules 601 where wafers are stored before and after processing. An atmospheric robot (not shown) in the atmospheric transfer chamber 619 first removes wafers from the source modules 601 to loadlocks 621. A wafer transfer device (generally a robot arm unit) in the transfer module 603 moves the wafers from loadlocks 621 to and among the modules mounted on the transfer module 603.

In certain embodiments, a system controller 650 is employed to control process conditions during deposition. The controller 650 will typically include one or more memory devices and one or more processors. The processor may include a CPU or computer, analog and/or digital input/output connections, stepper motor controller boards, etc.

The controller 650 may control all of the activities of the deposition apparatus. The system controller 650 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the control 650 may be employed in some embodiments.

Typically there will be a user interface associated with the controller 650. The user interface may include a display screen, graphical software displays of the apparatus and or process conditions, and user input devices such as pointing devices, keyboards, touch screens, microphones, etc.

System control logic may be configured in any suitable way. In general, the logic can be designed or configured in hardware and/or software. In other words, the instructions for controlling the drive circuitry may be hard coded or provided as software. It may be said that the instructions are provided by "programming." Such programming is understood to include logic of any form including hard coded logic in digital signal processors, application specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the deposition, annealing, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may hard coded.

The controller parameters relate to process conditions such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 650. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool.

The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiments were conducted to determine the effect of annealing substrates at various times and temperatures. In these experiments, wafers were processed using nucleation steps, optional treatment steps, CVD steps, and anneal steps. For purposes of these experiments, two sets of conditions were used in various experiments for the nucleation step.

Set A refers to the following set of conditions for the nucleation station. Substrate temperature is set at 250° C., and $B_2H_6$ and $WF_6$ are sequentially flowed for two cycles. Diversion of $B_2H_6$ is set at 1 second with a $B_2H_6$ purge time of 1 second and $WF_6$ purge time of 1 second. The flow rate of $WF_6$ is about 180 sccm. The $H_2$ flow of the front of the tool is about 27,000 sccm and the $H_2$ flow of the back of the tool is about 3000 sccm.

Set B refers to the following set of conditions for the nucleation station. Substrate temperature is set at 250° C., and $B_2H_6$ and $WF_6$ are flowed for two cycles. Diversion of $B_2H_6$ is set at 1.5 seconds with a $B_2H_6$ purge time of 2 seconds and $WF_6$ purge time of 2 seconds. The flow rate of $WF_6$ is about 220 sccm. The $H_2$ flow of the front of the tool is about 25,000 sccm and the $H_2$ flow of the back of the tool is about 10,000 sccm.

The second step for optional treatment involves substrates subject to five cycles of $B_2H_6$ pulses flow at a substrate temperature of 325° C. Next, the step for CVD of tungsten may involve $H_2$ and $WF_6$ flow and tungsten deposition at 325° C. Varying conditions of the annealing steps are used in the following experiments.

Experiment 1

Resistivity of tungsten films deposited using various anneal times was measured. For purposes of this experiment, Set A conditions were used. A 300 Å titanium nitride substrate was used in this experiment. The substrate was annealed after deposition of tungsten at a temperature of 445° C. using Ar flow. The argon flow rate was about 6000 sccm. Trials were conducted to determine resistivity of both about 60 Å tungsten films and about 90 Å tungsten films. The results are summarized in FIG. 7.

Figure 7:
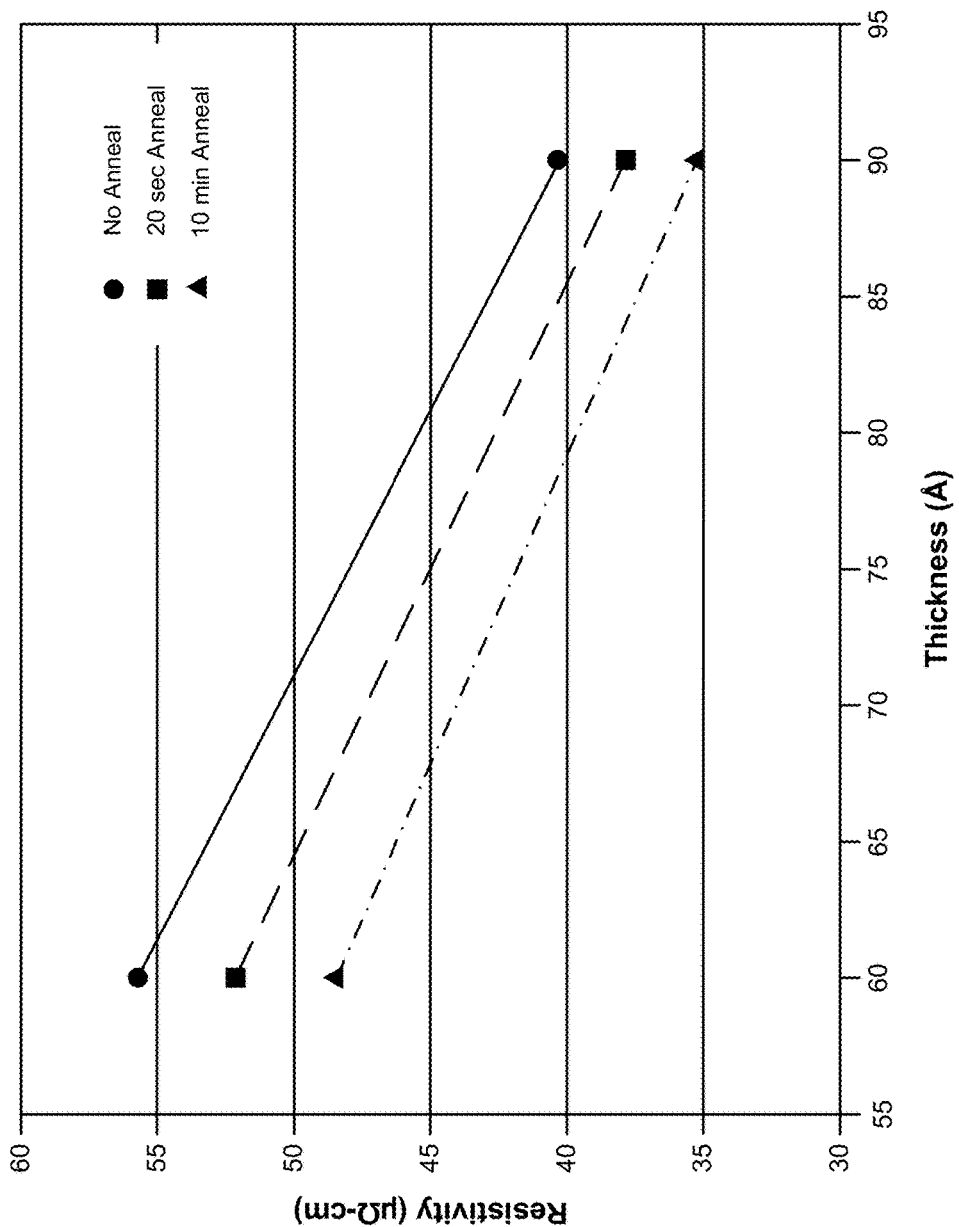
FIG. 7 shows a graph representing experimental data on annealing time in accordance with various embodiments.

The round points indicate resistivity of the films without an annealing step. The square points indicate resistivity of films using a 20-second anneal after deposition of the tungsten. Compared to the points representing no anneal, the resistivity substantially decreased. The triangular points indicate resistivity of films using a 10-minute anneal after deposition of the tungsten. Compared to the points representing no anneal, the resistivity is further decreased. It is noted here that the difference between the 20-second anneal and 10-minute anneal is almost the same as the difference between the 20-second anneal and no anneal, thereby suggesting that a threshold anneal time exists such that at a point in time, further annealing will result in the same resistivity. Nonetheless, as shown in FIG. 7, a post-deposition anneal for as short as 20 seconds can achieve substantially lower resistivity films. It is further believed that post-deposition anneals for as short as 1-5 seconds may also improve resistivity.

Experiment 2

Experiments were conducted to determine the effect of varying annealing temperatures on substrates. Conditions from Set A as recited above were used for deposition of a tungsten films on a 300 Å titanium nitride barrier layer on a substrate. Tungsten films were between about 86.5 Å and 90 Å in thickness. The substrate was annealed after tungsten deposition using argon flow for 20 seconds at varying temperatures. Data points were determined by measuring resistivity of a substrate before anneal, and measuring resistivity of the same substrate after anneal at a certain temperature. The results of this experiment are shown in FIGS. 8A and 8B.

Figure 8A:
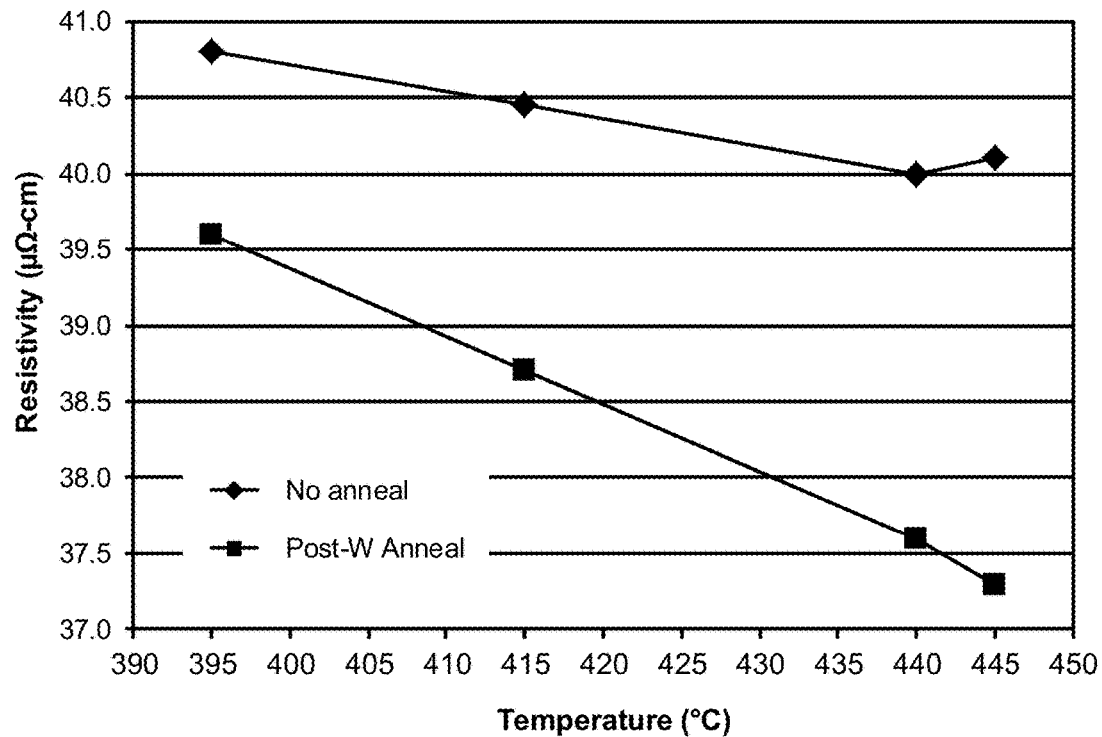
FIGS. 8A and 8B show graphs representing experimental data on annealing temperature in accordance with various embodiments.
Figure 8B:
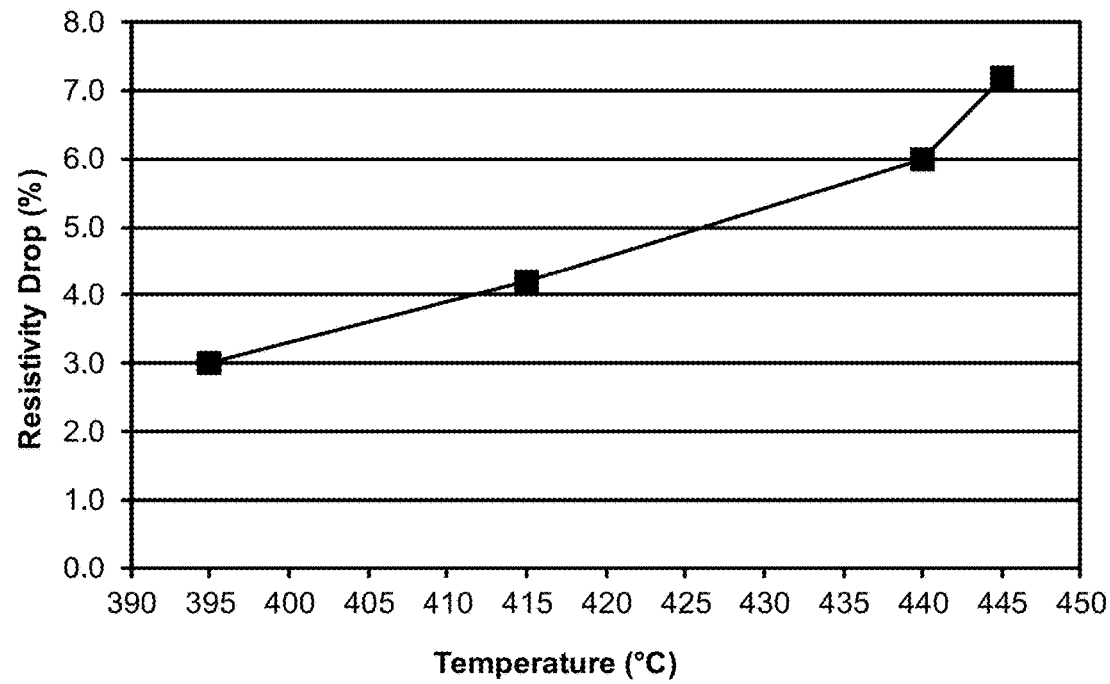

In FIG. 8A, the square shaped points represent the resistivity of the annealed substrates at various temperatures. The diamond shaped points represent the resistivity of each of those annealed substrates prior to the annealing step. For example, at 395° C., the substrate had a resistivity of about 40.8 μΩ-cm before annealing, but after annealing the resistivity lowered to 39.6 μΩ-cm, resulting in a resistivity improvement of about 3.0%. Resistivity improvement, or the trend in decreased resistivity, is shown in FIG. 8B. A subsequent trial was run to compare resistivity drop for a tungsten film annealed at 445° C. for 10 minutes (not shown in figures). The resulting resistivity drop was about 12.0%, substantially higher than the resistivity drop for using a 20-second anneal. According to the results, as anneal temperature increases, the difference in resistivity increases, thereby exhibiting a higher resistivity drop, and a better, lower resistivity tungsten films. The data suggests using a longer anneal time at a higher temperature to achieve the greatest resistivity drop and thus extremely low resistivity tungsten films.

Experiment 3

A series of experiments were conducted to determine the effect of the timing of annealing on resistivity. In the first experiment, conditions from Set A as recited above were used on 30 Å titanium nitride barrier layer on substrates. Three different variations were tested: (1) "pre-W anneal," which involved annealing before depositing any tungsten; (2) "pre-W and post-W anneal," which involved annealing both before and after depositing tungsten; and (3) "post-W anneal," which involved annealing after depositing tungsten.

Figure 9:
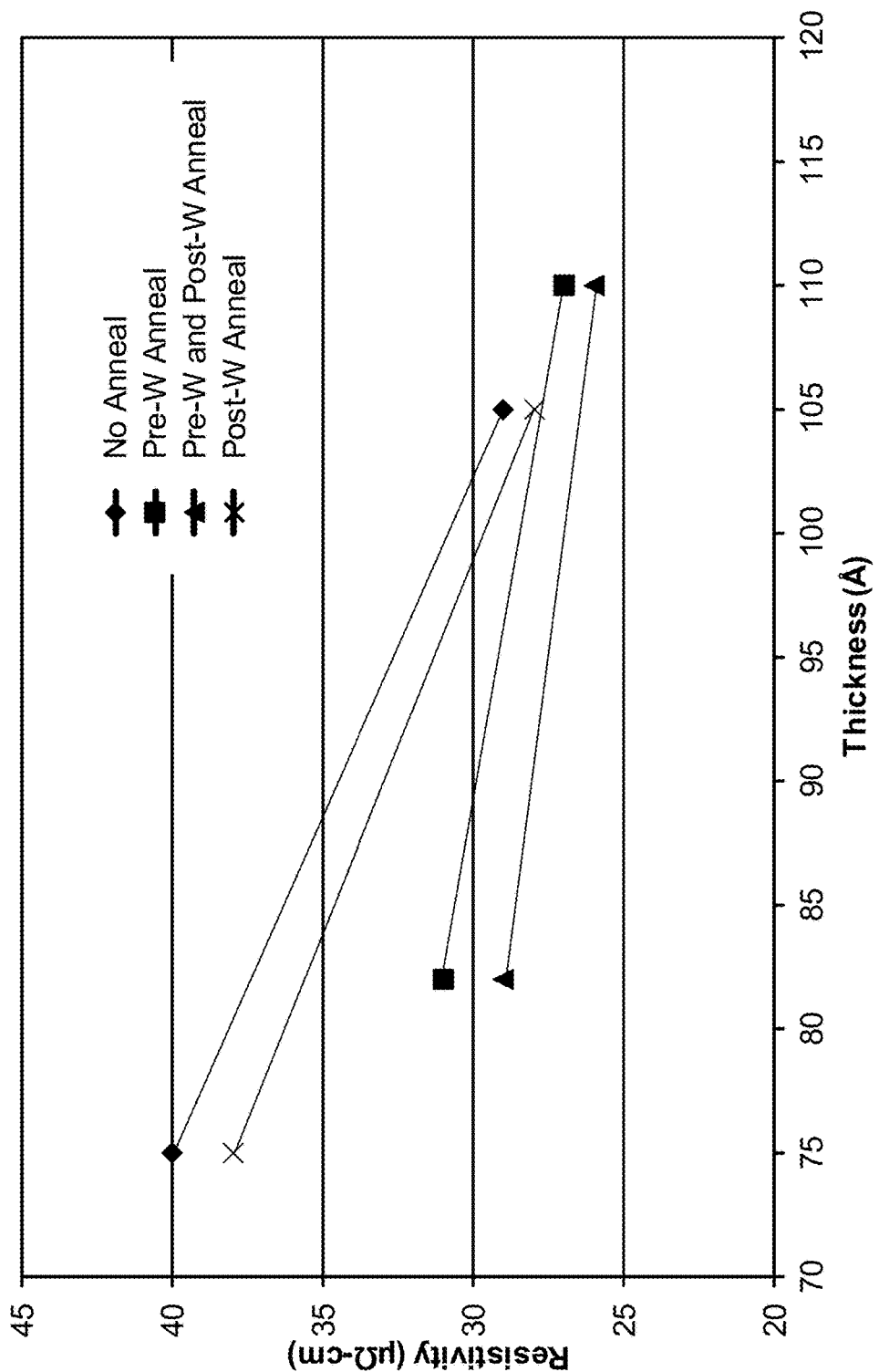
FIG. 9 shows a graph representing experimental data on timing of an annealing step in accordance with various embodiments.

To compare, trials were conducted for tungsten films without an annealing step. Annealing steps involved annealing at 445° C. for 10 minutes using either Ar (or Ar/H$_2$) flow. The results are shown in FIG. 9.

As shown in the figure, substrates deposited without an annealing step had the highest resistivity. For a 75 Å tungsten film, resistivity was about 40 µΩ-cm, as compared to a same thickness tungsten film with a post-W anneal which resulted in a resistivity of about 38 µΩ-cm. Using only a pre-W anneal had a higher resistivity for a film with a tungsten thickness of about 82 Å than when both a pre-W and post-W anneal were used. The data suggests that the optimal conditions for achieving extremely low resistivity tungsten films is to both anneal before and after depositing tungsten on the substrate.

In the second experiment, conditions from Set B as recited above were used on 300 Å titanium nitride barrier layers on substrates. Flow rates of H$_2$ in both the front and back of the tool were either 20,000 sccm or 30,000 sccm and 1,000 sccm or 15,000 sccm respectively. After tungsten deposition, substrates were annealed at 445° C. using argon (or Ar/H$_2$) for 10 minutes. Resistivity was measured before and after annealing for each of four substrates, as shown in Table 1 below.

TABLE 1

Resistivity and Post-Tungsten Deposition Annealing

| H$_2$ Flow (sccm) | Tungsten Thickness (Å) | No Anneal Resistivity (µΩ-cm) | Post-W Anneal Resistivity (µΩ-cm) | Resistivity Difference | Decrease in Resistivity |
|---|---|---|---|---|---|
| 30,000/1000 | 96.23 | 44.95 | 36.19 | 8.76 | 19% |
| 30,000/15,000 | 96.83 | 46.23 | 36.71 | 9.52 | 21% |
| 20,000/1000 | 108.48 | 78.27 | 52.61 | 25.66 | 33% |
| 20,000/15,000 | 107.84 | 76.76 | 52.61 | 26.16 | 34% |

The data suggests using a post-tungsten deposition anneal substantially decreases resistivity, regardless of the H$_2$ flow variations, and a higher decrease in resistivity is shown in films with a thicker layer of tungsten. Nonetheless, extremely low resistivity tungsten films were achieved, with a tungsten film having a resistivity as low as 36.19 µΩ-cm.

Experiment 4

Experiments were conducted to evaluate the atomic nature of the deposited tungsten films. Substrates that were not annealed showed a higher atomic content of boron than substrates that were annealed. Two wafers each with a 300 Å layer of titanium nitride barrier layer were compared. The first wafer was deposited subject to Set B conditions as recited above. A resulting wafer with a 127 Å tungsten layer was evaluated using x-ray photoelectron spectroscopy, which indicated an atomic boron content of 5.107%. The second wafer was deposited subject to Set B conditions as recited above, except with an added anneal step after the nucleation step, and an added anneal step instead of the last CVD deposition such that the low temperature CVD of tungsten deposited the bulk tungsten. The 91 Å tungsten wafer was annealed at 445° C. for 10 minutes using argon flow with a flow rate of about 6000 sccm, or Ar/H$_2$ flow with a flow rate of about 6000 sccm and about 7000 sccm, respectively. X-ray photoelectron spectroscopy was used to evaluate the boron content. Surprisingly, the boron content in the annealed substrate had an atomic content of only 0.555%, indicating a substantial decrease by a factor of 10 in boron content as compared to the wafer that was not annealed. This supports the theory that annealing may be purifying the tungsten layer such that gases such as boron are released to decrease resistivity.

Figure 10A:
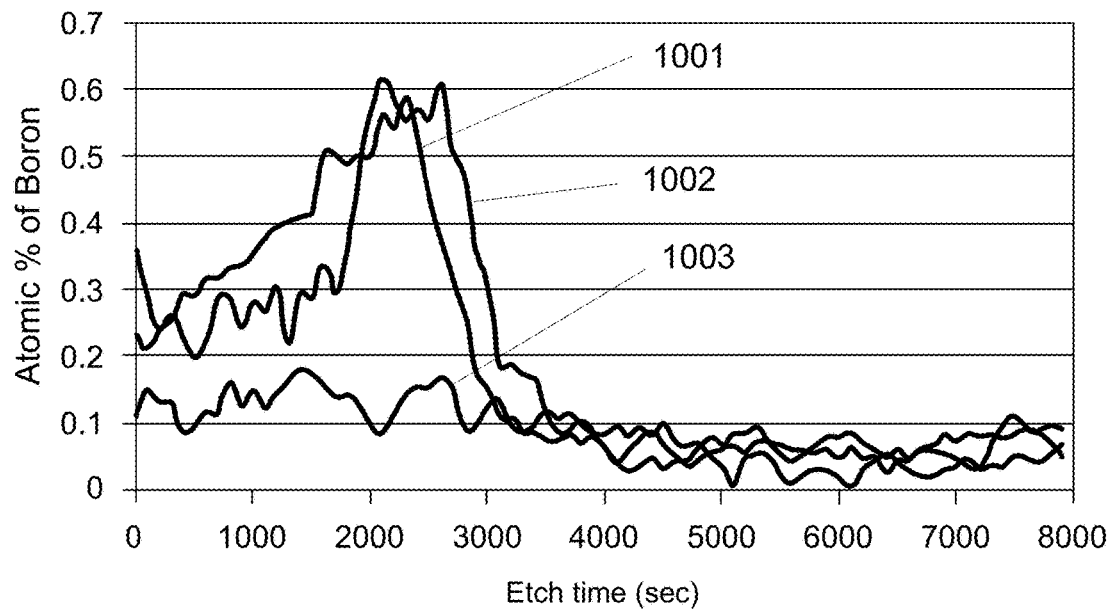
FIGS. 10A and 10B show graphs representing experimental data on boron content in accordance with various embodiments.

Experiments were conducted on substrates with varying thicknesses of titanium nitride. All anneal steps in these experiments involved annealing at 445° C. for 10 minutes with argon flow with a flow rate of about 6000 sccm, or Ar/H$_2$ flow with a flow rate of about 6000 sccm and about 7000 sccm, respectively. A first wafer with a 30 Å layer of titanium nitride barrier layer was subject to the conditions in Set A as recited above including an anneal before and after tungsten deposition. The boron content over etch time was measured and is shown in FIG. 10A and represented by 1001. A second wafer with a 30 Å layer of titanium nitride barrier layer was subject to conditions in Set A as recited above including an anneal after the tungsten deposition. The boron content over etch time was measured and is shown in FIG. 10A and represented by 1002. A third wafer with a 30 Å layer of titanium nitride as a barrier layer was subject to conditions in Set B as recited above, including an anneal after nucleation and an anneal after tungsten bulk deposition. The boron content over etch time was measured and is shown in FIG. 10A and represented by 1003. It is noted that all three wafers exhibited atomic boron content of less than 0.7%, a significantly low amount.

A 300 Å titanium nitride barrier layer was deposited on the next wafer. This wafer was subject to conditions in Set B as recited above and did not include an anneal step. Boron content of this no-anneal wafer is represented by the solid, no-anneal line represented in FIG. 10B. Lastly, a 300 Å titanium nitride barrier layer was deposited on a last wafer. This wafer was subjected to conditions in Set B as recited above, including annealing after nucleation and annealing after tungsten bulk deposition. The boron content over etch time was measured and is represented by the dotted line, labeled "with anneal" in FIG. 10B. As shown, the wafer that was annealed had an atomic content of boron less than 1%, which is significantly lower than the boron content in the non-annealed wafer, which was as high as over 5%.

Figure 10B:
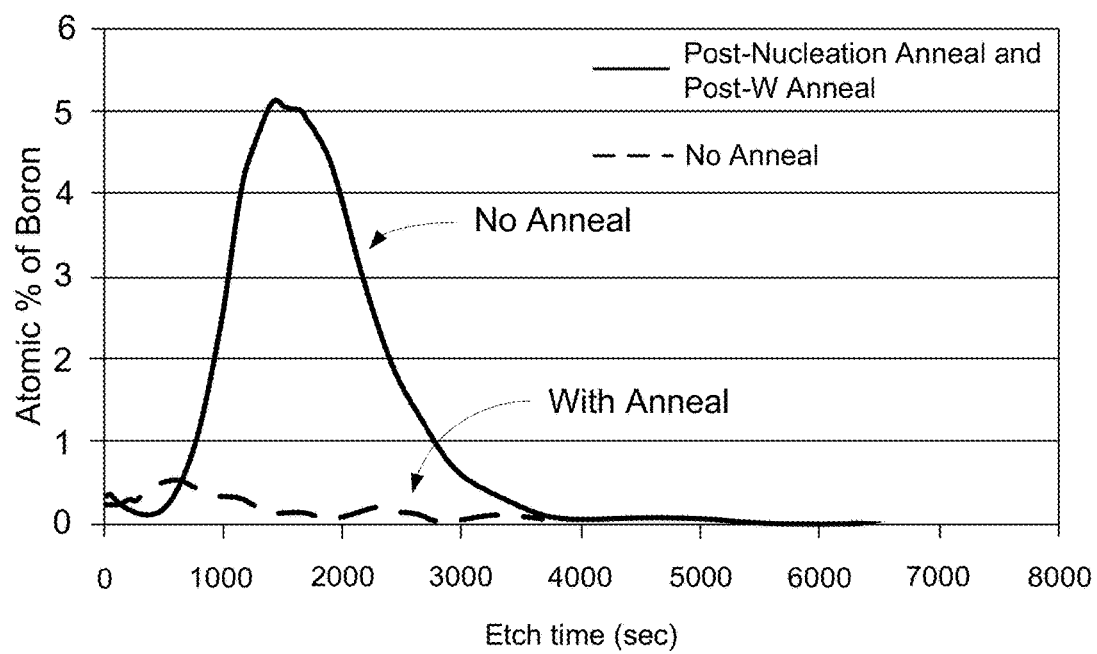

Overall, FIGS. 10A and 10B both suggest that boron content may contribute to the resistivity of the deposited tungsten film on the substrate.

Experiment 5

Figure 11:
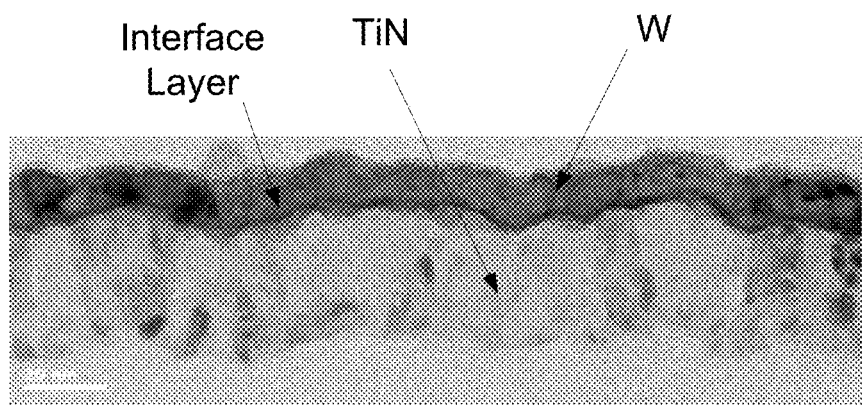
FIG. 11 shows an image of deposited layers.

Experiments were conducted to determine the effect annealing had on uniformity of the deposited layers. FIG. 11 shows an image of deposited a titanium nitride and a tungsten layer without an annealing step. As shown in FIG. 11, an interface layer exists between the titanium nitride layer and tungsten layer.

Figure 12:
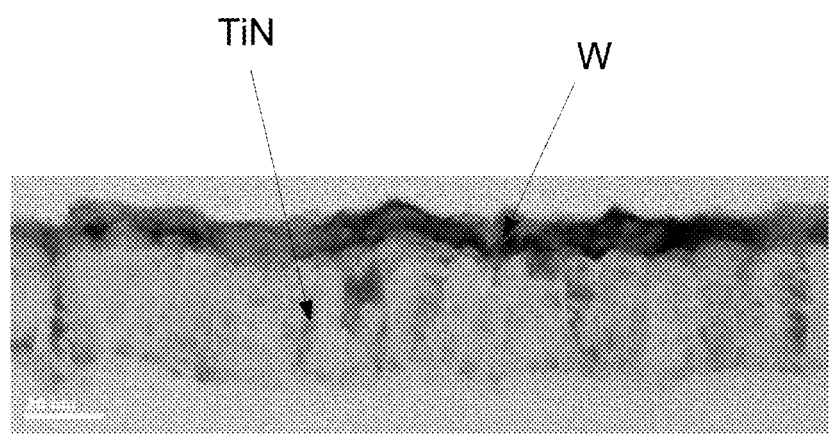
FIG. 12 shows an image of deposited layers in accordance with various embodiments.

In contrast, FIG. 12 shows an image of a titanium nitride layer and an annealed tungsten layer. In these images, the tungsten was deposited before annealing the substrate at 445° C. for 20 seconds. FIG. 12 shows a substantial decrease in the interface layer and uniformity in the resulting film. This is a surprising result because the layers are smooth and have low resistivity, whereas conventional tungsten films with low resistivity may tend to be less smooth due to the granularity of the film. This phenomenon may provide support for the theory that annealing rearranges grains in the tungsten film, thereby reducing the resistivity.

Experiment 6

Figure 13A:
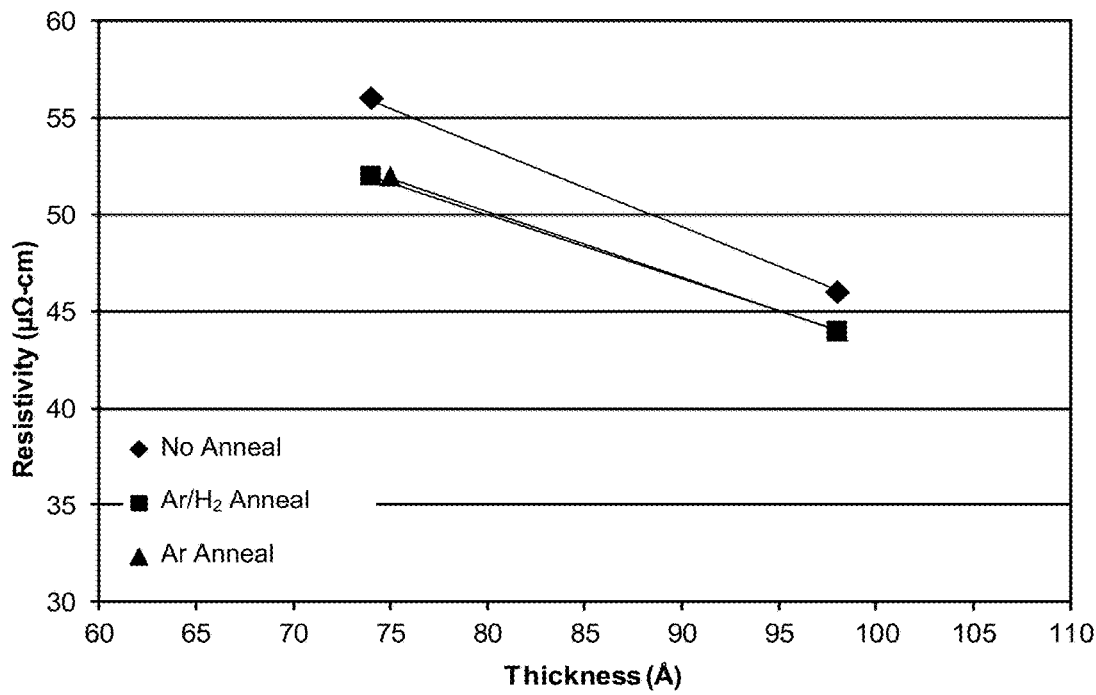
FIGS. 13A and 13B show graphs representing experimental data on flow chemistry in accordance with various embodiments.
Figure 13B:
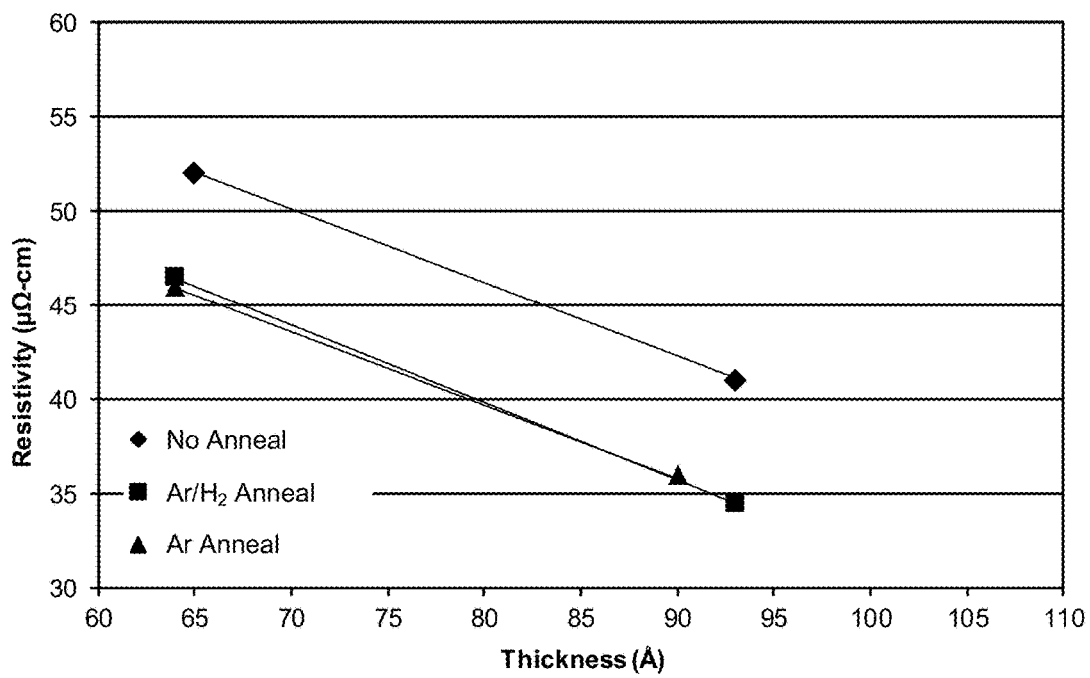

A series of experiments were conducted to determine whether the type of gas used during annealing affected the resulting resistivity of the deposited tungsten on the substrate. In the first experiment, substrates with a 300 Å titanium nitride barrier layer were used. The conditions from Set B as recited above were used, and comparisons were made between wafers that were not annealed, wafers annealed with argon and hydrogen, and wafers annealed with just argon. Annealing steps occurred at 445° C. for 10 minutes after tungsten deposition. Resistivity results are shown in FIG. 13A. The diamond points represent measurements of resistivity for wafers that were not annealed, whereas the square points represent measurements of resistivity for wafers annealed with $Ar/H_2$ and the triangular points represent measurements of resistivity for wafers annealed with only Ar. The points for both the $Ar/H_2$ anneal and Ar anneal are very similar for similar thicknesses of tungsten, thus suggesting that using either $Ar/H_2$ or Ar is suitable for annealing.

A similar trend resulted from a second experiment. In the second experiment, substrates with a 300 Å titanium nitride barrier layer were used. The conditions from Set A as recited above were used, and wafers were annealed at 445° C. for 10 minutes after tungsten deposition using Ar only and $Ar/H_2$. For comparison, a substrate deposited using conditions from Set A as recited above was not annealed. The resulting resistivity of each of these wafers is plotted in FIG. 13B. The diamond shaped points represent measurements of resistivity of wafers that were not annealed. Square points represent measurements of resistivity of wafers annealed with $Ar/H_2$ and triangular points represent measurements of resistivity of wafers annealed with only Ar. Similar to FIG. 13A, the resulting resistivity of wafers annealed with Ar and $Ar/H_2$ were very similar for similar thicknesses of tungsten deposited, thereby suggesting that either $Ar/H_2$ or Ar can be used during the annealing process.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method of forming a tungsten film on a substrate, the method comprising:
   providing the substrate with a nitride layer;
   annealing the nitride layer;
   depositing tungsten directly on the nitride layer to form the tungsten film by introducing a vapor phase tungsten-containing precursor and a boron-containing reactant into a chamber housing the substrate; and
   annealing the tungsten film,
      wherein the nitride layer is annealed before the tungsten is deposited, and
      wherein the nitride layer is annealed at a temperature between about 385° C. and about 445° C.,
      wherein annealing the tungsten film reduces the boron content of the tungsten film by a factor of 10.

2. The method of claim 1, wherein the nitride layer is a tungsten nitride layer.

3. The method of claim 1, wherein argon gas is flowed during annealing.

4. The method of claim 1, wherein the tungsten is deposited by chemical vapor deposition.

5. The method of claim 1, wherein annealing the nitride layer is performed at conditions to change the grain structure of the nitride layer.

6. The method of claim 1, wherein depositing the tungsten directly on the nitride layer to form the tungsten layer comprises depositing a tungsten nucleation layer on the nitride layer after annealing the nitride layer, and annealing the tungsten nucleation layer.

7. The method of claim 6, wherein the nucleation layer is annealed at a temperature between about 385° C. and about 445° C.

8. The method of claim 1, wherein the tungsten film is annealed for no more than 1 minute.

9. The method of claim 1, wherein the pressure during the annealing of the tungsten film is at least 1 Torr.

10. The method of claim 1, wherein the tungsten film nucleates on the nitride layer.

11. The method of claim 1, wherein the annealing the nitride layer does not change the composition of the nitride layer.

12. The method of claim 1, wherein the nitride layer is a titanium nitride layer.

13. A method of forming a tungsten film on a substrate, the method comprising:
   providing the substrate with a nitride layer;
   changing the grain structure of the nitride layer; and
   depositing tungsten directly on the nitride layer to form the tungsten film by introducing a vapor phase tungsten-containing precursor and a boron-containing reducing agent into a chamber housing the substrate,
      wherein the grain structure of the nitride layer is changed before the tungsten is deposited, and
      wherein the tungsten film formed on the nitride layer has a boron content of less than 1%.

14. The method of claim 13, wherein changing the grain structure of the nitride layer comprises annealing the nitride layer.

* * * * *